US012660116B2

(12) United States Patent
Tsorng et al.

(10) Patent No.: US 12,660,116 B2
(45) Date of Patent: Jun. 16, 2026

(54) ADAPTABLE CAGE PARTITIONS FOR HOLDING DIFFERENT THICKNESS E3.S MODULES

(71) Applicant: Quanta Computer Inc., Taoyuan City (TW)

(72) Inventors: Yaw-Tzorng Tsorng, Taoyuan City (TW); Tung-Hsien Wu, Taoyuan City (TW); Hsiang-Pu Ni, Taoyuan City (TW); Ren-Zhi Zhang, Taoyuan City (TW)

(73) Assignee: Quanta Computer Inc., Taoyuan City (TW)

( * ) Notice: Subject to any disclaimer, the term of this patent is extended or adjusted under 35 U.S.C. 154(b) by 84 days.

(21) Appl. No.: 18/763,659

(22) Filed: Jul. 3, 2024

(65) Prior Publication Data

US 2026/0013063 A1     Jan. 8, 2026

(51) Int. Cl.
| | |
|---|---|
| *H05K 7/14* | (2006.01) |
| *G06F 1/187* | (2026.01) |
| *G11B 33/02* | (2006.01) |
| *H05K 5/02* | (2006.01) |

(52) U.S. Cl.
CPC ........... *H05K 7/1425* (2013.01); *G06F 1/187* (2013.01); *G11B 33/022* (2013.01); *H05K 5/0291* (2013.01); *H05K 7/1435* (2013.01)

(58) Field of Classification Search
CPC .. H05K 7/1425; H05K 5/0291; H05K 7/1435; G06F 1/187; G11B 33/022
See application file for complete search history.

(56) References Cited

U.S. PATENT DOCUMENTS

| | | | | |
|---|---|---|---|---|
| 2019/0335603 A1* | 10/2019 | Schulze | ............... | H05K 7/1424 |
| 2024/0256008 A1* | 8/2024 | Moore | ................. | H05K 7/1489 |
| 2024/0288915 A1* | 8/2024 | Grady | ..................... | G06F 1/187 |
| 2025/0224776 A1* | 7/2025 | Wang | ..................... | G06F 1/187 |

* cited by examiner

*Primary Examiner* — Robin J Mishler
(74) *Attorney, Agent, or Firm* — NIXON PEABODY LLP

(57) ABSTRACT

A cage divider that is adaptable for different E3.S modules for insertion in a slot of a computing device is disclosed. The cage divider is one of a pair of cage dividers that define a cage enclosure for insertion of the E3.S modules. Each of the cage dividers includes a first side component plate attachable to the backplane of the cage enclosure. Each of the dividers includes a second side component parallel to the first side component and attached to the first side component. Each of the dividers includes an adjustable accessory held between the first side component and the second side component. The adjustable accessory is configured to be attached in a first position allowing accommodation of a first E3.S module or a second position allowing accommodation of a second E3.S module.

19 Claims, 23 Drawing Sheets

ADAPTABLE CAGE PARTITIONS FOR HOLDING DIFFERENT THICKNESS E3.S MODULES

TECHNICAL FIELD

The present disclosure relates generally to dividers for a cage structure allowing use of different carriers with a server. More particularly, aspects of this disclosure relate to a cage divider assembly that may be used for different E3.S module form factors.

BACKGROUND

Electronic devices, such as servers, include numerous electronic components that are powered by a common power supply. Generally, servers are directed toward specific functions such as storing or processing large amounts of data. Server design begins with a chassis that includes power components and general controllers such as a baseboard management controller. Current large server designs include a cage for accommodating additional solid state drive (SSD) device cards and other types of device cards. Multiple device cards may be installed in the cages in slots for the devices that are defined by dividers. The devices are in uniform form factors for insertion into the cage to mate with registration features on the dividers.

As explained previously, insertable device form factors may include solid state drive (SSD) based expansion cards to increase storage capability of the server. The current generation of SSD cards are based on carriers for the memory devices based on the E3.S standard. The Enterprise and Datacenter Standard Form Factor (EDSFF) E3 standard is a family of form factors designed to update and replace the traditional U.2 2.5-inch form factor used previously in servers and storage systems. These hot-pluggable drives are designed more optimally for flash density of the SSD and system chassis. The connector for the E3 family form factor is designed for x4 to x16 PCIe lanes. The E3 standard is designed for future servers and storage systems to accommodate the next generations of PCI Express and can accommodate device types such as GPUs and network interface cards (NIC)s as well as the SSDs.

The E3.S standard includes a single-width form factor module specification and a double-width form factor module specification that each have different thicknesses. The single-width specification is referred to as the E3.S 1T and the double-width specification is referred to as the E3.S 2T standard.

FIG. 1A shows an exploded view of an E3.S module 10 with a single-width storage device 12 on a carrier 14. FIG. 1B shows the assembled E3.S module 10 with the single width device 12 held by the carrier 14. The carrier 14 includes a bracket 16 that is attached to an edge of a bottom panel 18. The bottom panel 18 includes an extended registration feature 20. The device 12 includes a gold finger connector 22 that may be connected to a socket connector on a computing device.

FIG. 1C shows an exploded view of a E3.S module 30 with a double-width storage device 32 and a carrier 34. FIG. 1D shows the E3.S module 30 of the assembled E3.S carrier 34 and the double-width storage device 32. The carrier 34 includes a bracket 36 that is attached to an edge of a bottom panel 38. The bottom panel 38 includes an extended registration feature 40. The double-width storage device 32 includes a gold finger connector 42 that may be connected to a socket connector on a computing device. The registration feature 40 differs from the registration feature 20 of the single width carrier 10 in FIG. 1A.

Because of the thickness difference in the two form factors, server vendors currently need to provide mechanical designs for each of the two types of E3.S modules. FIG. 2A shows an example 1U server 50 that includes a cage area 52 near the front of the server 50. The cage area 52 allows E3.S single width modules such as the module 10 shown in FIG. 1B to be inserted. FIG. 2B shows a front view of the example 1U server 50 with a set of single width device modules 56 inserted in the cage 52 of the server 50. A series of four dividers 54 that are installed in the cage 52 create the slots to accommodate a stack of four single width carrier modules 56 in the five enclosures created between the dividers 54. Thus, a total of 20 E3.S modules, each including a carrier with a storage device, may be inserted in the cage area 52 of the example 1U server 50.

FIG. 2C shows the example 1U server 50 that includes a series of four dividers 64 that allows the cage 52 to hold a stack of two double width modules 66 between each of the dividers 64. FIG. 2D shows a front view of the example 1U server 50 with the double width carriers 66 inserted in the cage 52 in the cage enclosures defined between the dividers 64. In this example, the four dividers 64 create five slots, and thus 10 total double width modules such as the E3.S module 30 in FIG. 1D may be held.

To satisfy the system configuration variability and foolproof design, different types of cage dividers 54 and 64 in FIGS. 2A and 2C, respectively, are required for the two different types of E3.S modules. This increases the complexity in manufacturing and parts supplies as two different dividers must be manufactured for the insertion of different carrier form factors in the cage area 52.

Thus, there is a need for a divider mechanism that allows different E3.S form factor carriers to be inserted in a cage in a chassis. There is also a need for a mechanism that allows simple adjustments to change compatibility with E3.S 1T and 2T modules.

SUMMARY

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

One disclosed example is a cage divider for a cage enclosure for different E3.S device carrier modules. The cage divider includes a first side component attachable to a backplane of the cage enclosure. A second side component is parallel to the first side component and is attached to the first side component. An adjustable accessory is held between the first side component and the second side component. The adjustable accessory is configured to be attached in a first position allowing accommodation of a first E3.S module or a second position allowing accommodation of a second E3.S module.

In another implementation of the disclosed example divider, the adjustable accessory includes a tab blocking insertion of the second E3.S module when in the first position and blocking insertion of the first E3.S module when in the second position. In another implementation, the adjustable accessory includes a slot inserted on a registration pin coupled to the first side component. In another implementation, the backplane includes connectors for connecting either the first E3.S module or the second E3.S module. In another implementation, the adjustable accessory includes a locking screw insertable in one of a plurality of mounting holes in a side plate of the second side component. One of the plurality of mounting holes corresponds to the first position and another of the plurality of mounting holes corresponds to the second position. In another implementation, the first type of E3.S module is a E3.S 1T form factor including a carrier and an electronic device and the second type of E3.S module is a E3.S 2T form factor including a carrier and an electronic device. In another implementation, the electronic device is a solid state drive (SSD). In another implementation, the first side component includes a tab for attachment to either a first backplane having a connector mating with the first E3.S module or a second backplane having a connector mating with the second E3.S module. In another implementation, the first and second side components include rivet holes allowing insertion of rivets to attach the first and second side components to each other.

Another disclosed example is a computer device including a chassis and a cage defined by the chassis. A backplane is at a rear of the cage. A pair of cage dividers defines a slot in the cage. Each of the cage dividers includes a first side component plate attachable to the backplane of the cage enclosure. Each of the dividers includes a second side component parallel to the first side component and attached to the first side component. Each of the dividers includes an adjustable accessory held between the first side component and the second side component. The adjustable accessory is configured to be attached in a first position allowing accommodation of a first E3.S module or a second position allowing accommodation of a second E3.S module.

In another implementation of the disclosed example computer device, the adjustable accessory includes a tab blocking insertion of the second E3.S module when in the first position, and blocking insertion of the first E3.S. module when in the second position. In another implementation, the adjustable accessory includes a slot inserted on a registration pin coupled to the first side component. In another implementation, the backplane includes connectors for connecting either the first E3.S module or the second E3.S module. In another implementation, the adjustable accessory includes a locking screw insertable in one of a plurality of mounting holes in a side plate of the second side component. One of the plurality of mounting holes corresponds to the first position and another of the plurality of mounting holes corresponds to the second position. In another implementation, the first type of E3.S module is a E3.S 1T form factor including a carrier and an electronic device, and the second type of E3.S module is a E3.S 2T form factor including a carrier and an electronic device. In another implementation, the electronic device is a solid state drive (SSD). In another implementation, the first side component includes a tab for attachment to either a first backplane having a connector mating with the first E3.S module or a second backplane having a connector mating with the second E3.S module. In another implementation, the first and second side components include rivet holes allowing insertion of rivets to attach the first and second side components to each other. In another implementation, the computer device is a server.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

Figure 1A:
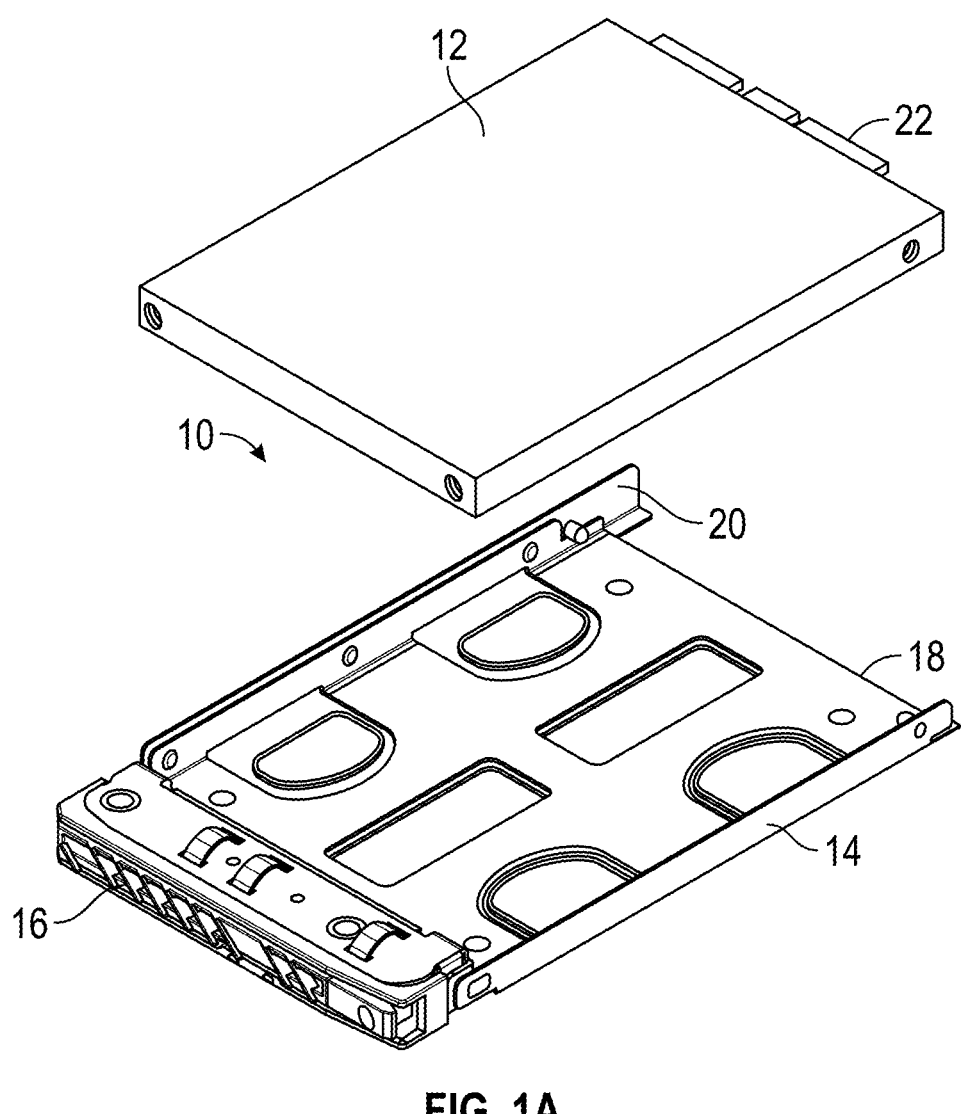
FIG. 1A shows an exploded view of a prior art solid state drive device and carrier form factors defined by the E3.S standard for a single thicknesses.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

The present disclosure is directed toward an adaptable cage divider that allows different E3.S form factor types to be inserted into a cage of a computing device. The divider includes a first lateral side component that is attached to a backplane and a second parallel lateral side component to allow adjustment of the divider. The two lateral side components form the sides of each slot defined by the dividers. An adjustable accessory supported between the lateral side components allows the divider to be converted to accommodate either the single width modules or the double width module. The second lateral side component allows the fixing of the adjustable accessory in position. In this manner, only one type of cage divider is required for either type of E3.S module.

Figure 1D:
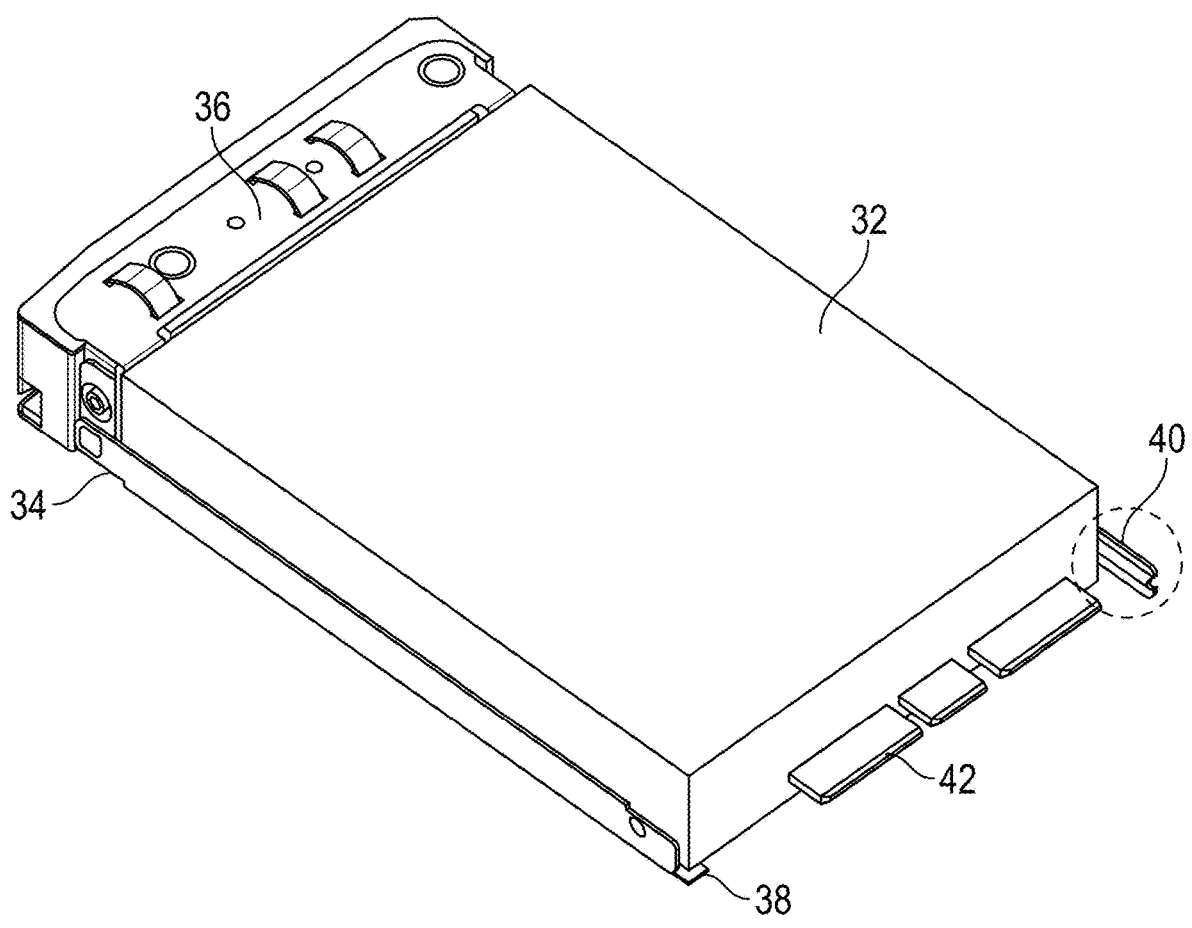
FIG. 1D shows an assembled view of the prior art E.3 module with the solid state drive and carrier in FIG. 1C.
Figure 2A:
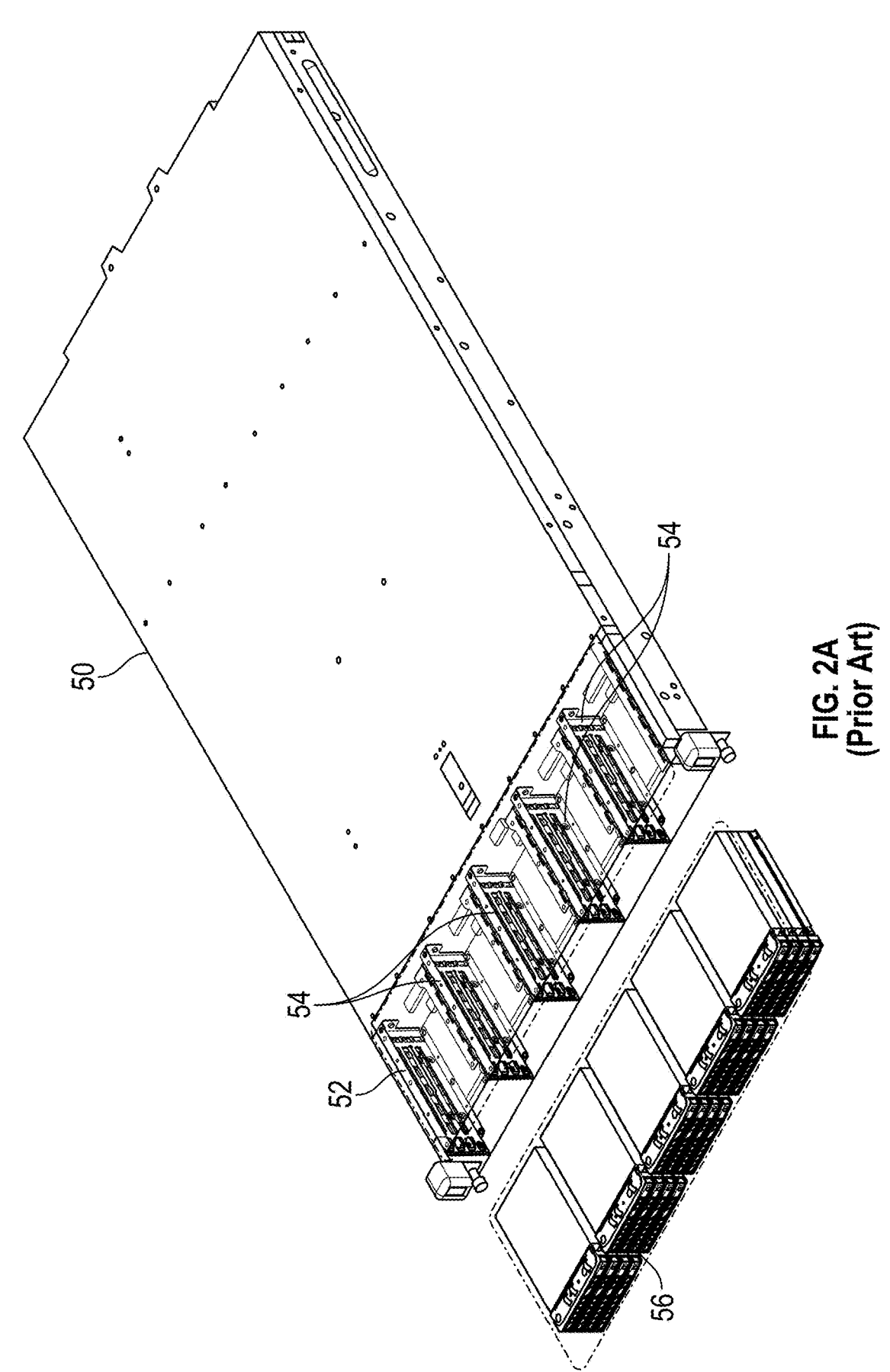
FIG. 2A is a perspective view of an example prior art server chassis with a cage having dividers that allow holding the single width E.3 module in FIG. 1B.
Figure 2B:
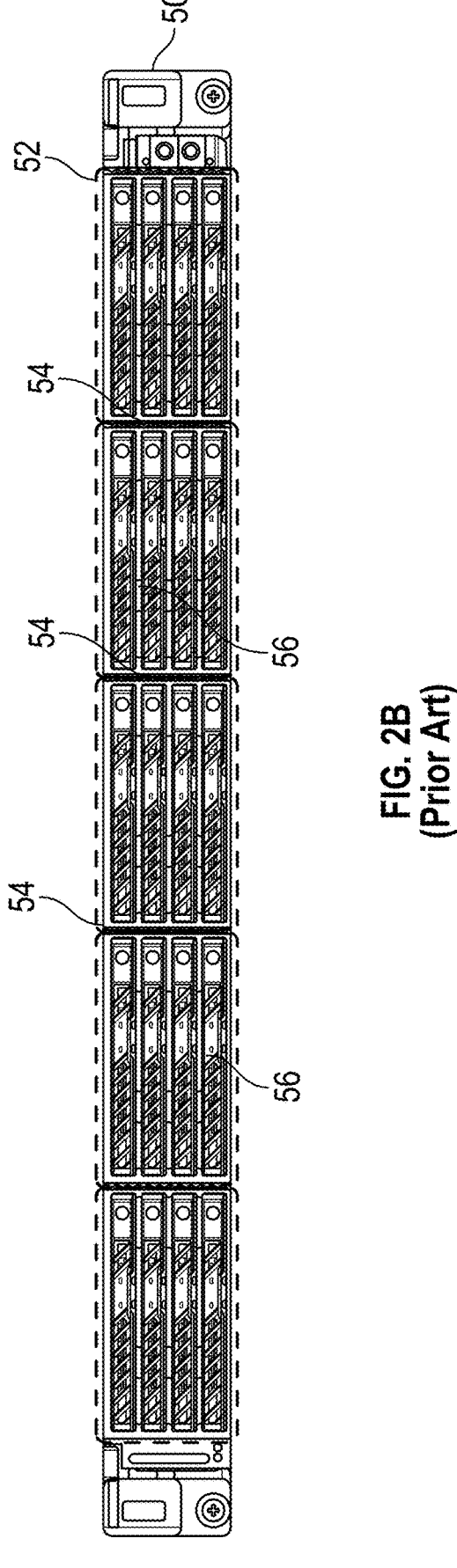
FIG. 2B is a front view of the server chassis with inserted modules such as the module in FIG. 1B.
Figure 2C:
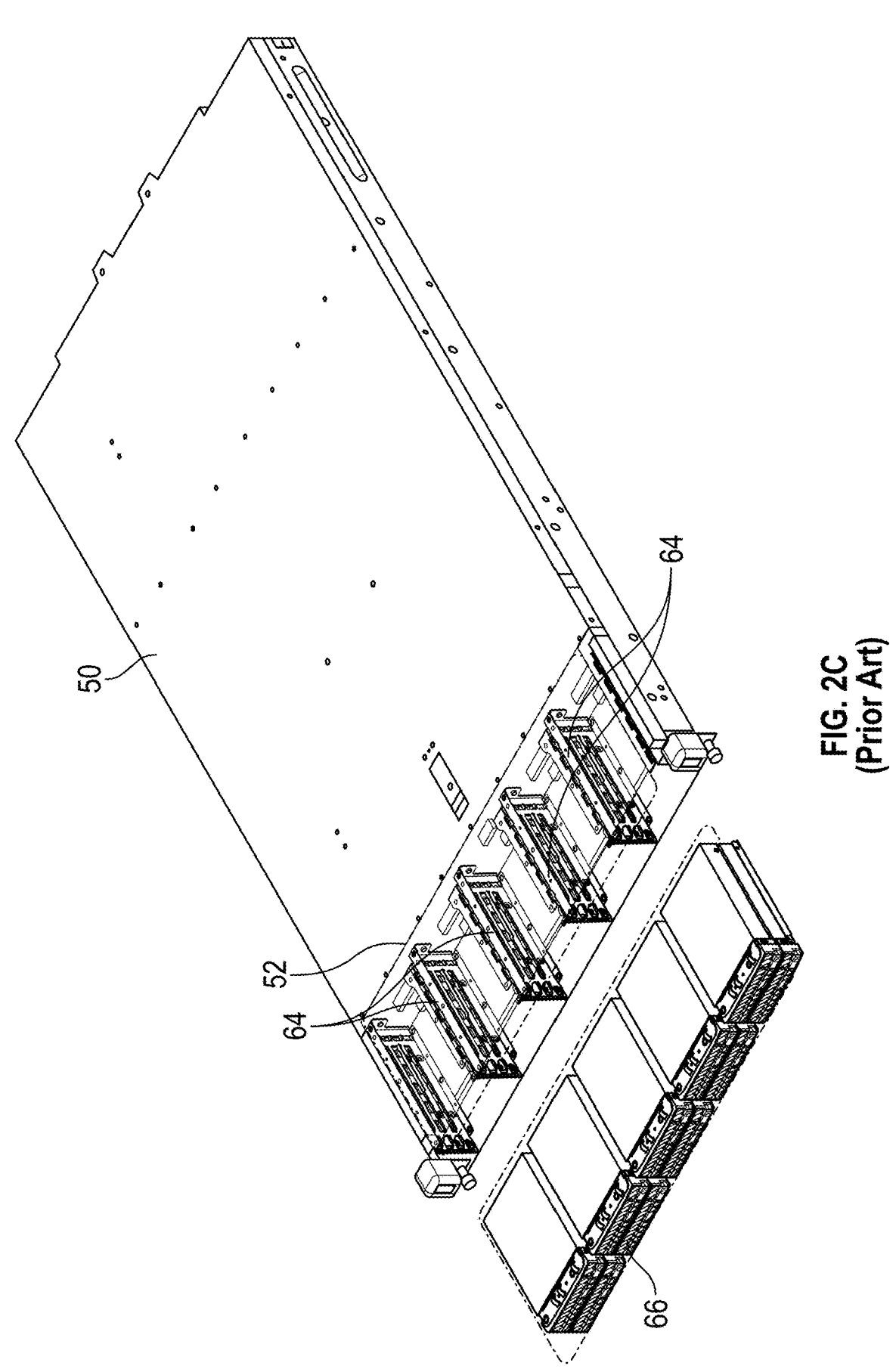
FIG. 2C is a perspective view of an example prior art server chassis with a cage having dividers that allow holding the double width E.3 module in FIG. 1D.
Figure 2D:
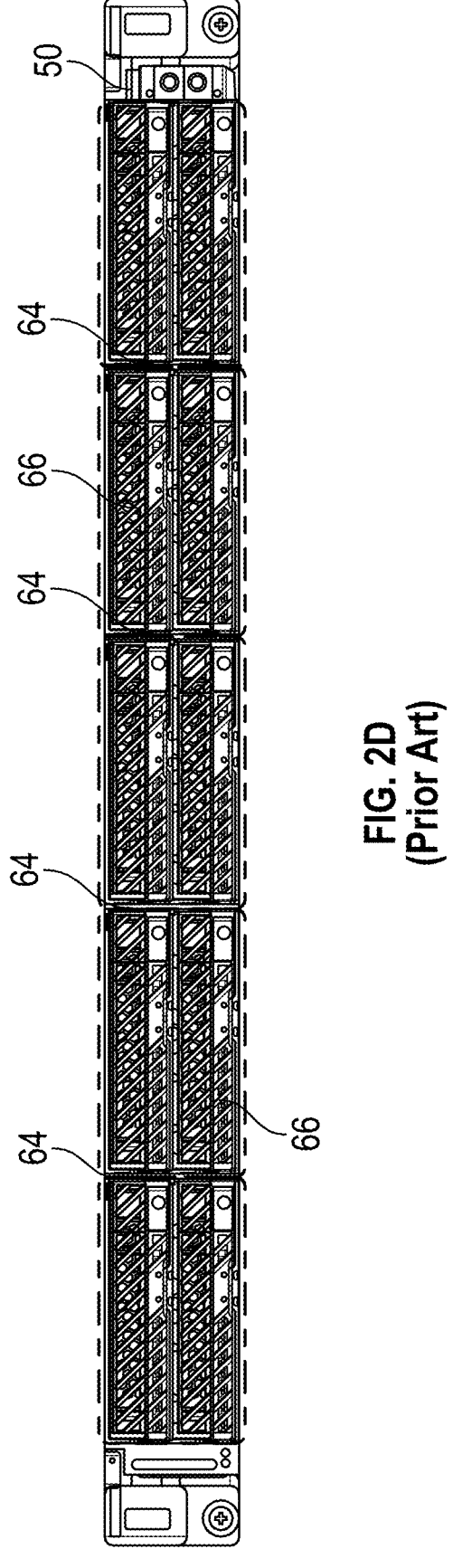
FIG. 2D is a front view of the server chassis with inserted modules such as the module in FIG. 1D.
Figure 3:
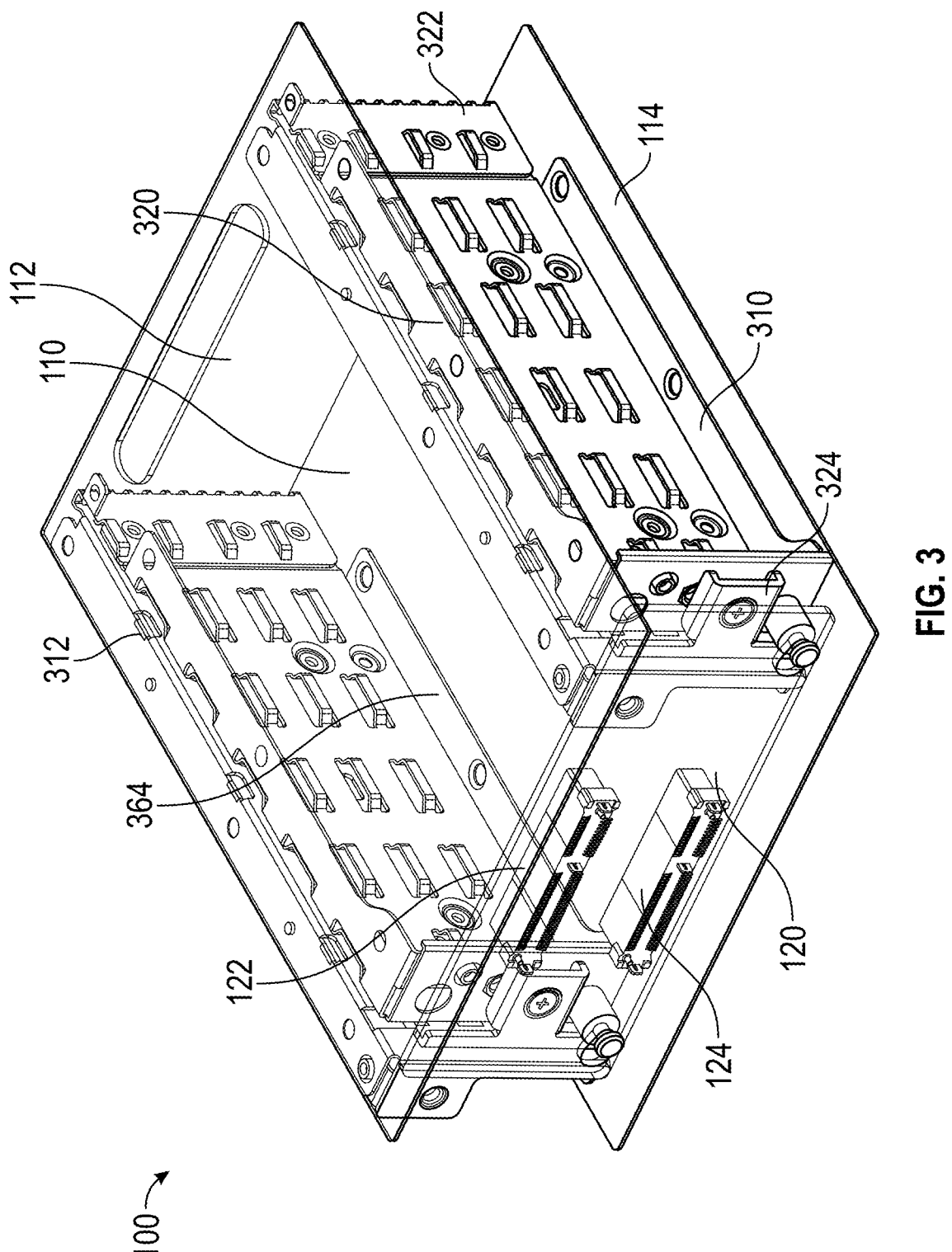
FIG. 3 is a perspective view of an example server chassis with example adaptable cage dividers that may accommodate both single and double width E3.S modules.

FIG. 3 shows a perspective view of a cage 100 that may be defined on the chassis of the server 50 in FIG. 2A. The cage 100 is defined by the server chassis and is generally accessible from the front of the server. A cage enclosure 110 is defined by a top cover 112 and a bottom base 114. The cage enclosure 110 is further defined by two example cage dividers 310 and 312 that are positioned between the top cover 112 and the bottom base 114 to define device slots for holding E3.S modules. The front side of the cage enclosure 110 is open to allow insertion of E3.S modules in the device slots between the cage dividers 310 and 312. The back of the cage enclosure 110 includes a backplane 120 that allows electrical connection of the E3.S modules to the components of the server. The backplane 120 may be either a 1T or a 2T backplane depending on the type of E3.S modules. In this example, the backplane 120 supports double width E3.S 2T modules such as the module 30 in FIG. 1D. Thus, the backplane 120 has two socket connectors 122 and 124 for the two E3.S 2T modules that may be inserted in the cage enclosure 110.

The cage dividers 310 and 312 are identical. The cage dividers 310 and 312 create slots to allow the cage enclosure 110 to accommodate either four E3.S 1T modules or two E3.S 2T modules. The following describes the cage divider 310 but applies to the other identical cage divider 312. The cage divider 310 includes a first lateral side component 320 and a second lateral side component 322 that are attached to each other along with an example adjustable accessory 324. The first side component 320 allows attachment of the divider 310 to a backplane, while the second side component 322 allows locking of the position of the adjustable accessory 324. The slot of the cage enclosure 110 in FIG. 3 is created by the first side component 320 of the divider 310 and the second side component of the divider 312. As will be explained, the position of the adjustable accessory 324 relative to the side components 320 and 322 allows the divider to be used with either E3.S 1T modules or E3.S 2T modules.

Figure 4A:
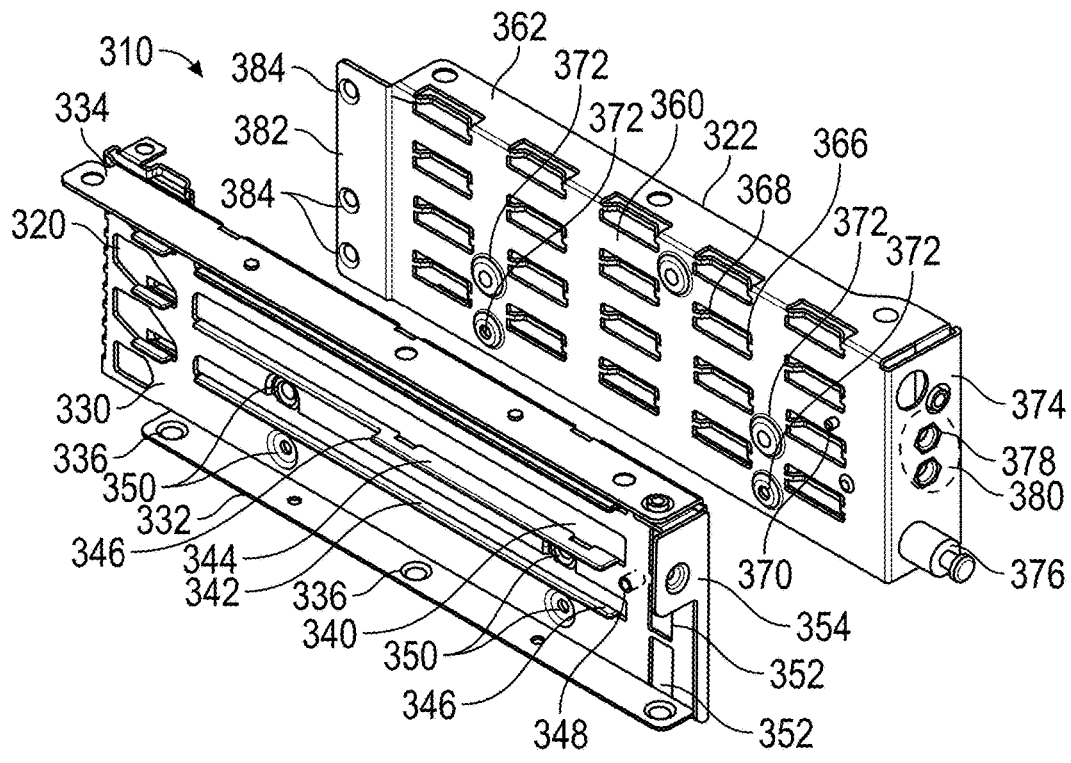
FIG. 4A is a perspective view of the assembly of the example panels of the example adaptable cage divider in FIG. 3.
Figure 4B:
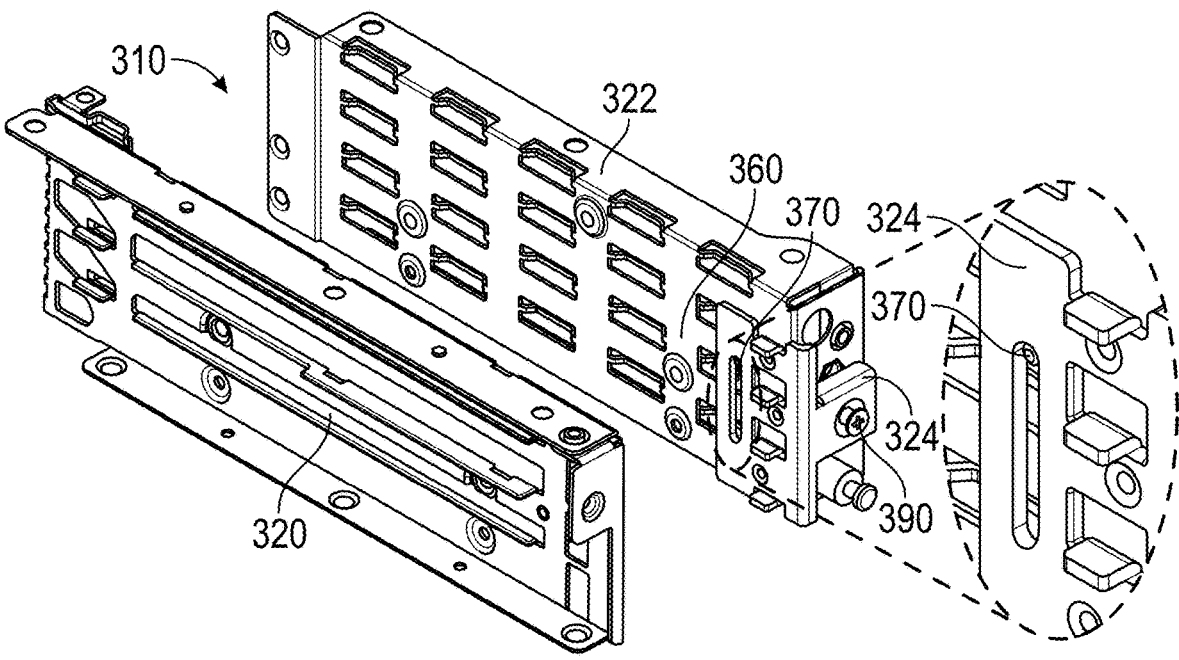
FIG. 4B is a perspective view of the assembly of the example adaptable cage divider adding the adjustable accessory.
Figure 4C:
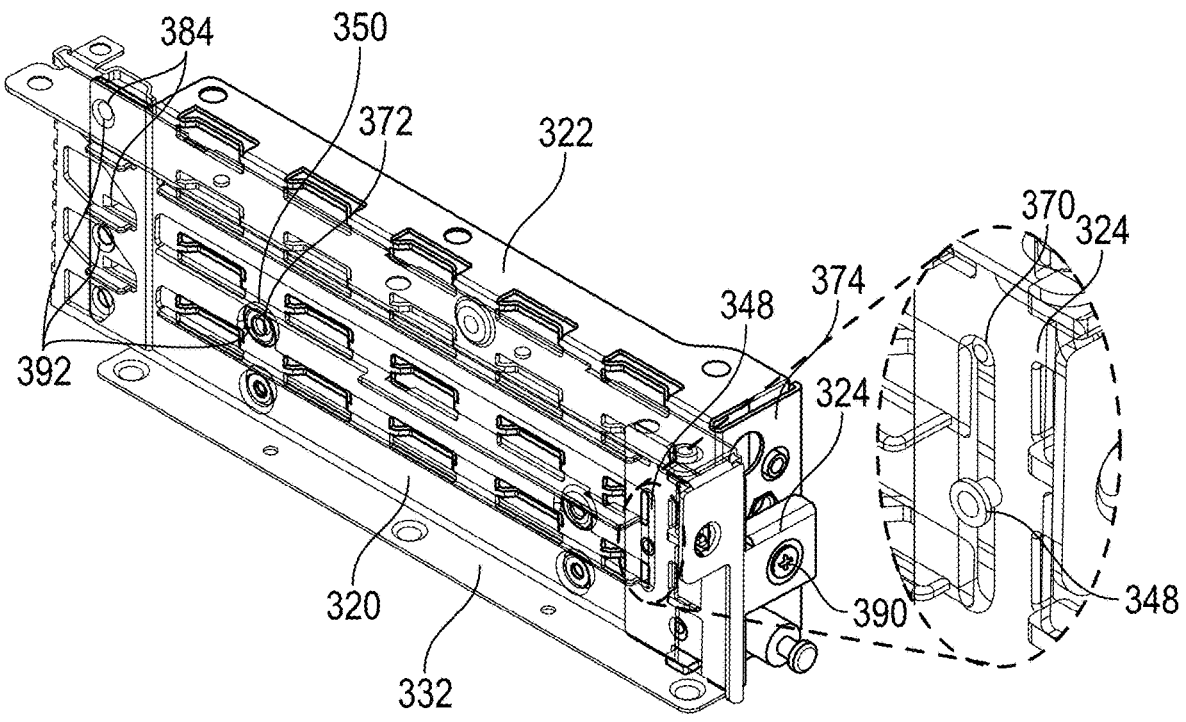
FIG. 4C is a perspective view of the assembly of the completed adaptable cage divider where the adjustable accessory is positioned to accommodate single width E3.S modules such as those in FIG. 1A.

FIGS. 4A-4C show the sequence of assembling the cage divider 310. As shown in FIG. 4A, the first side component 320 includes a main vertical plate 330 that forms a side of the cage enclosure 110. The main plate 330 includes a bottom flange 332 that is perpendicular to the main vertical plate 330. A top flange 334 is parallel to the bottom flange 332. The flanges 332 and 334 extend from the respective bottom and top edges of the main plate 330. The bottom flange 332 has a series of holes 336 that allow screws to attach the bottom flange 332 to the base 114 in FIG. 3. The main plate 330 has two parallel horizontal slots 340 and 342. A tab 344 extends from the bottom edge of the slot 340. The tab 344 extends between the rear side of the plate 330 to the middle of the plate 330. The edge 346 of the tab 344 is at a height to prevent improper insertion of an E3.S 2T module by blocking the insertion of such a module and thus serves as a fool proof feature. A registration pin 348 extends from the rear end of the main plate 330. A set of four rivet holes 350 are provided on the main plate 330. A series of three vertical slots 352 are positioned in the main plate 330 in proximity to the registration pin 348. The three vertical slots 352 accommodate registration features of the adjustable accessory 324 in FIG. 3. A back plate 354 is joined to the back edge of the main plate 330 and the top flange 334. The back plate 354 allows the divider 310 to be attached to a backplane such as the backplane 120 in FIG. 3.

The side component 322 includes a main vertical plate 360 that is parallel to the main plate of the side component 320. The main vertical plate 360 forms the opposite side of the cage enclosure 110 from the main vertical plate 330 of the divider 312 in FIG. 3. A top flange 362 is perpendicularly attached to the top edge of the main vertical plate 360. A bottom flange 364 (shown on the divider 312 in FIG. 3) is perpendicularly attached to the bottom edge of the main vertical plate 360. The bottom flange 364 has holes for screws for attachment to the base 114 in FIG. 3.

The main vertical plate 360 has four rows of slots 366 at four different heights. Each of the slots 366 defines a tab 368 that extends from the plate 360. A registration pin 370 extends from the vertical plate 360 near the rear end. A set of four rivet holes 372 are provided on the vertical plate 360. An end plate 374 joins the rear end of the top flange 362 and the main vertical plate 360. A self-clinching standoff fastener 376 extends from the end plate 374 to limit the position of a E3.S 1T module. In this example, there is keyhole slot in the example backplanes such as the 2T backplane 120. The larger hole in the keyhole slot is aligned with the standoff 376. Once inserted, the standoff 376 is slid to the other side of the keyhole slot. At this point, the smaller hole of the keyhole slot cannot pass over the standoff, thus securing the backplane in place. A 1T alignment hole 378 and a 2T alignment hole 380 are located on the end plate 374. A front flap 382 extends from the front end of the vertical plate 360. The front flap 382 includes three rivet holes 384.

FIG. 4B shows the attachment of the adjustable accessory 324 to the end plate 374 of the side component 322. The adjustable accessory 324 includes a main plate that is placed on the side component 322. The registration pin 370 of the vertical plate 360 is inserted in the slot of the main plate of the adjustable accessory 324.

FIG. 4C shows the attachment of the first side component 320 to the second side component 322 after the adjustable accessory 324 is attached to the side component 322. The main plate of the adjustable accessory 324 is inserted between the vertical plates 330 and 360. The registration pin 348 of the vertical plate 330 is inserted in the slot of the flange of the attachment accessory 324. Rivets 392 are then inserted in the aligned rivet holes 350 and 372, and holes 384 to join the plates 330 and 360 together.

The slot where the pins 348 and 370 are inserted allows the adjustable accessory 324 to be moved up and down relative to the plates 330 and 360. Thus, the adjustable accessory 324 may be attached by a captive screw 390 to the end plate 374 in either the 1T alignment hole 378 or the 2T alignment hole 380 in FIG. 4A. In this example, the adjustable accessory 324 is moved downward relative to the registration pins 348 and 370 in the slot. The captive screw 390 is then inserted into the lower 2T alignment hole 380 (in FIG. 4A), and thus the adjustable accessory 324 allows the cage divider 310 to be used for double width E3.S form factor modules. As will be explained, the adjustable accessory 324 could be moved up on the slot guided by the pins 348 and 370 and the captive screw 390 could be inserted in the upper 1T alignment hole 378 (in FIG. 4A).

Figure 5A:
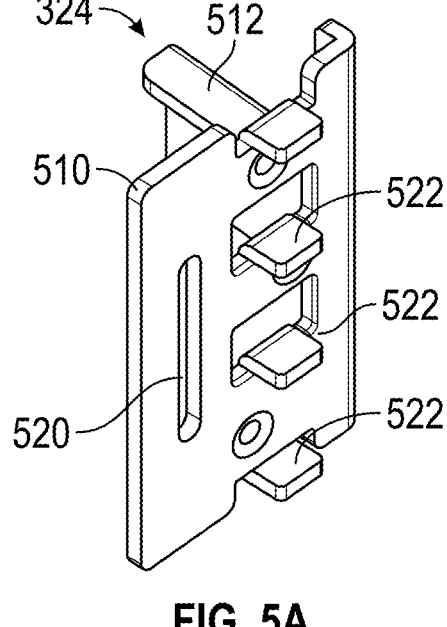
FIG. 5A is a perspective view of the adjustable accessory used with the cage divider shown in FIG. 4A.
Figure 5B:
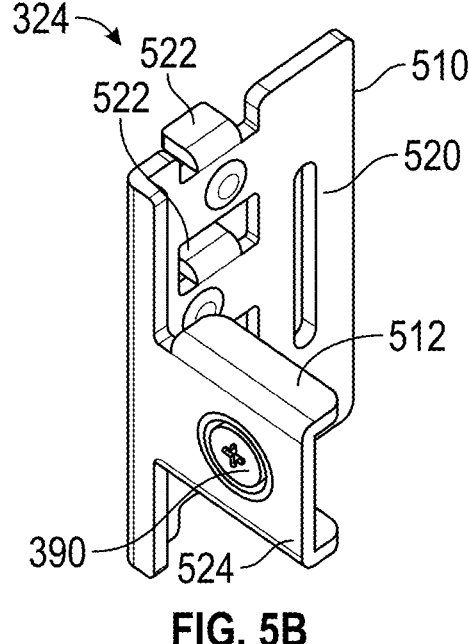
FIG. 5B is a reverse perspective view of the adjustable accessory in FIG. 5A.

FIG. 5A is a perspective view of the example adjustable accessory 324. FIG. 5B is a reverse perspective view of the example adjustable accessory 324. The adjustable accessory 324 has a main plate 510 and a perpendicular flange 512. As explained above, the main plate 510 is inserted between the first side component 320 and the second side component 322 in FIG. 4C. The main plate 510 has a vertical integrated slot 520 that allows the registration pins 348 and 370 in FIG. 4A to be inserted. The main plate 510 also has a series of three extended tabs 522. The tabs 522 serve as stoppers for the E3.S 1T and 2T modules when improperly inserted in the cage enclosure 110 defined by the dividers 310 and 312 in FIG. 3. A screw hole 524 in the flange 512 allows the insertion of the captive screw 390 in FIG. 4C.

The tabs 522 of the adjustable accessory 324 each correspond to a stopper for the E3.S 1T and 2T modules in a conventional cage divider design. The adjustable accessory 324 also features the integrated slot 520 and a hole for the captive screw 390. The slot 520 on the adjustable accessory 324 allow for sliding adjustment with the pins 348 and 370 on the cage divider 310. The adjustable accessory 324 may be moved relative to the pins 348 and 370 that are inserted in the integrated slot 520. The adjustable accessory 324 may be moved relative to the pins 348 and 370 to allow the captive screw 390 to be inserted in either the 1T hole 378 or the 2T hole 380 in the end plate 374 to securely fasten the adjustable accessory 324 onto the side component 322 of the cage divider 310.

Figure 6A:
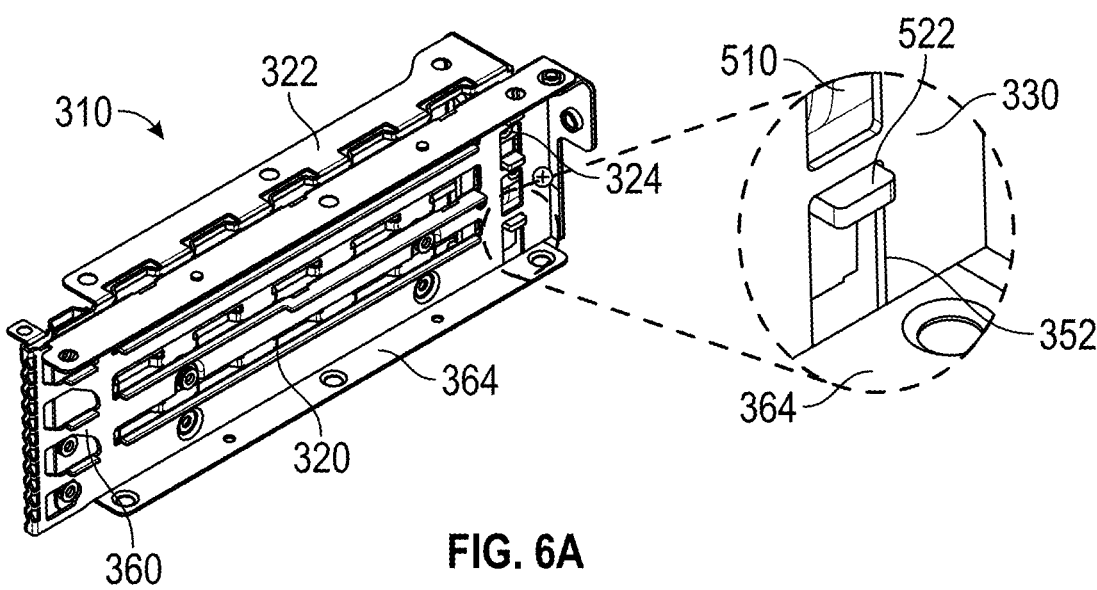
FIG. 6A is a close-up perspective view of the positioning of the adjustable accessory in the divider in FIG. 4A to accommodate single width E3.S form factor modules.

As shown above, the slot 520 of the adjustable accessory 324 is inserted on the pins 348 and 370 on the side components 320 and 322 of the divider 310 in FIG. 4B. The side components 320 and 322 are then attached to each other by the rivets 392 in FIG. 4C. The adjustable accessory 324 may still be moved relative to the pins 348 and 370. As shown in FIG. 6A, when the cage enclosure 110 requires installation of E3.S 1T modules, the adjustable accessory 324 may be moved on the pins 348 and 370 to a E3.S 1T fixed location. The adjustable accessory 324 may be secured in this position by the captive screw 390 being inserted into the 1T hole 378. The cage divider 310 thus becomes a divider specifically for E3.S 1T modules. In this position, the tabs 522 are positioned at the top of the vertical slots 352 of the vertical plate 330. As will be explained, the tabs 522 in this position prevent the erroneous insertion of an E3.S 2T module.

Figure 6B:
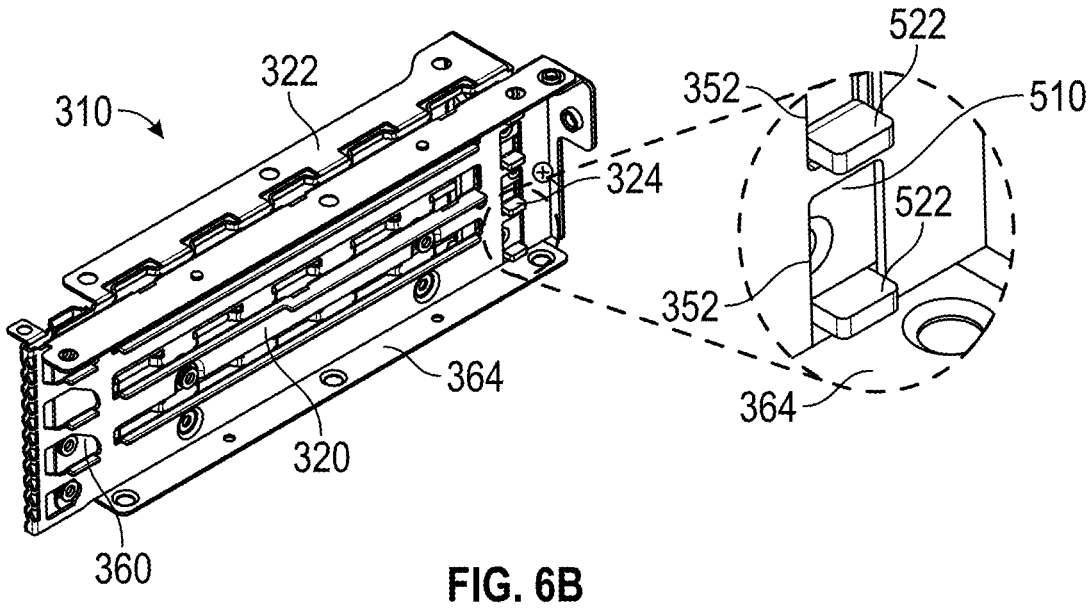
FIG. 6B is a close-up perspective view of the positioning of the adjustable accessory in the divider in FIG. 4A to accommodate double width E3.S form factor modules.

Conversely, the adjustable accessory 324 may be moved on the pins 348 and 370 to a E3.S 2T fixed location as shown in FIG. 6B. The adjustable accessory 324 may be secured in this position through the captive screw 390 being inserted into the 2T hole 380. The divider 310 thus becomes a divider specifically for E3.S 2T modules. In this position, the tabs 522 are positioned at the bottom of the vertical slots 352 of the vertical plate 330. As will be explained, the tabs 522 in this position prevent the erroneous insertion of an E3.S 1T module.

Figure 1B:
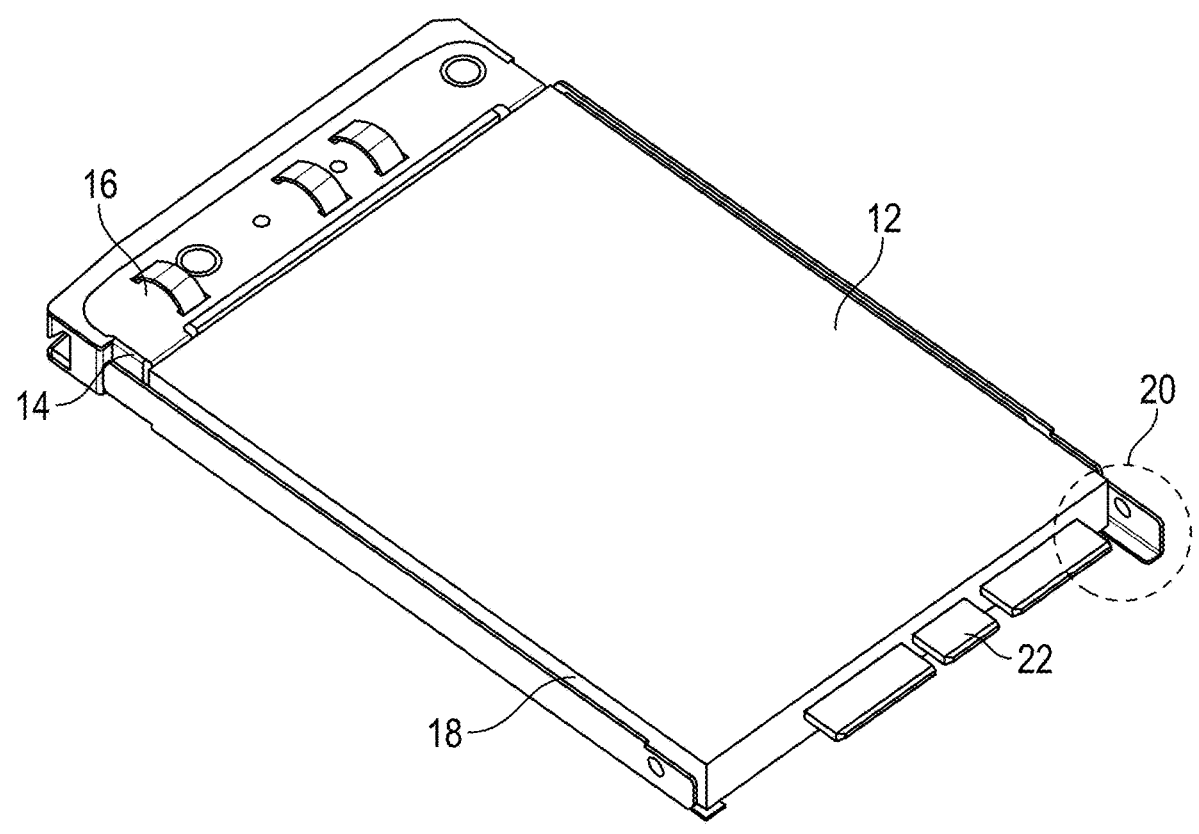
FIG. 1B shows an assembled view of the prior art E3 module with the solid state drive and carrier in FIG. 1A.
Figure 1C:
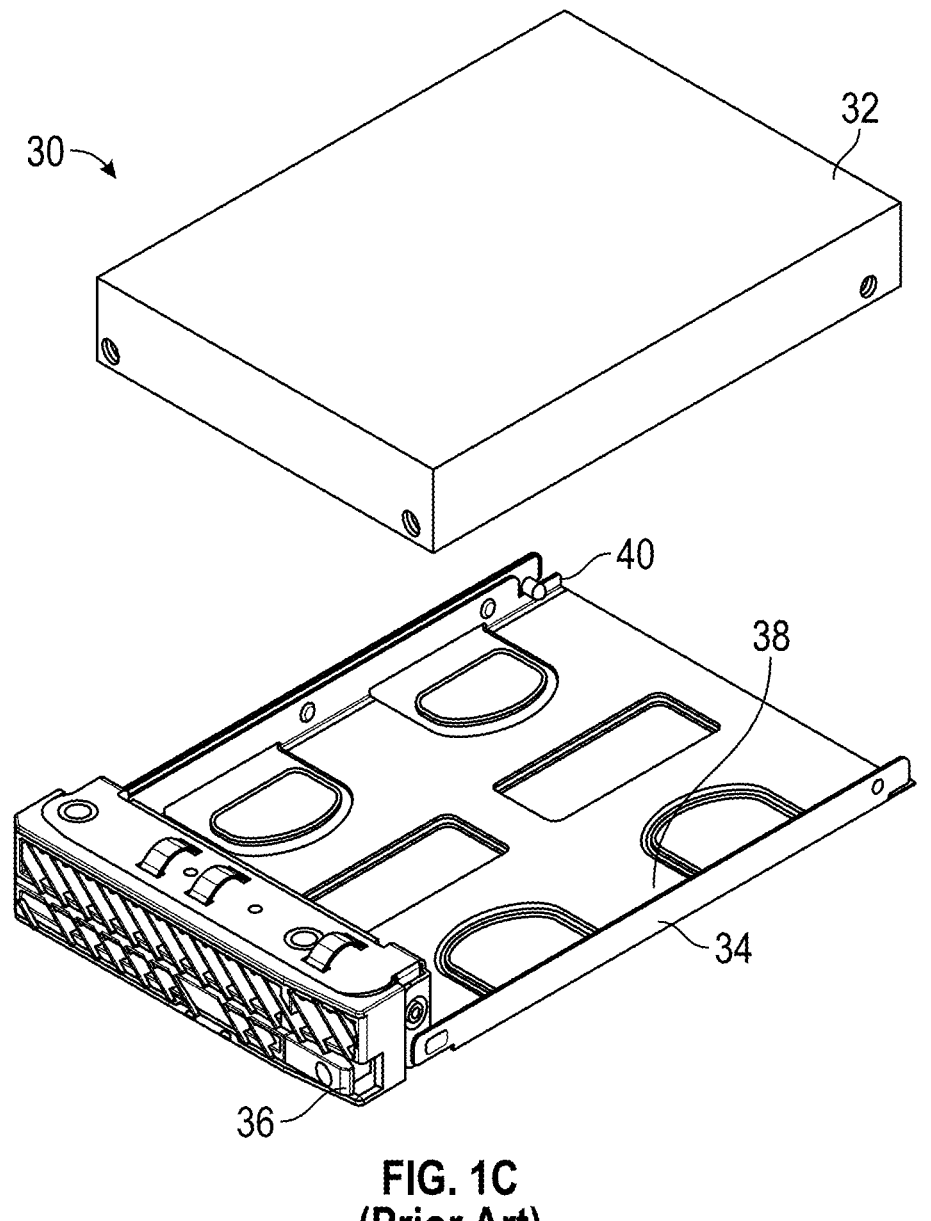
FIG. 1C shows an exploded view of a prior art solid state drive device and carrier form factors defined by the E3.S standard for a dual thicknesses.
Figure 7A:
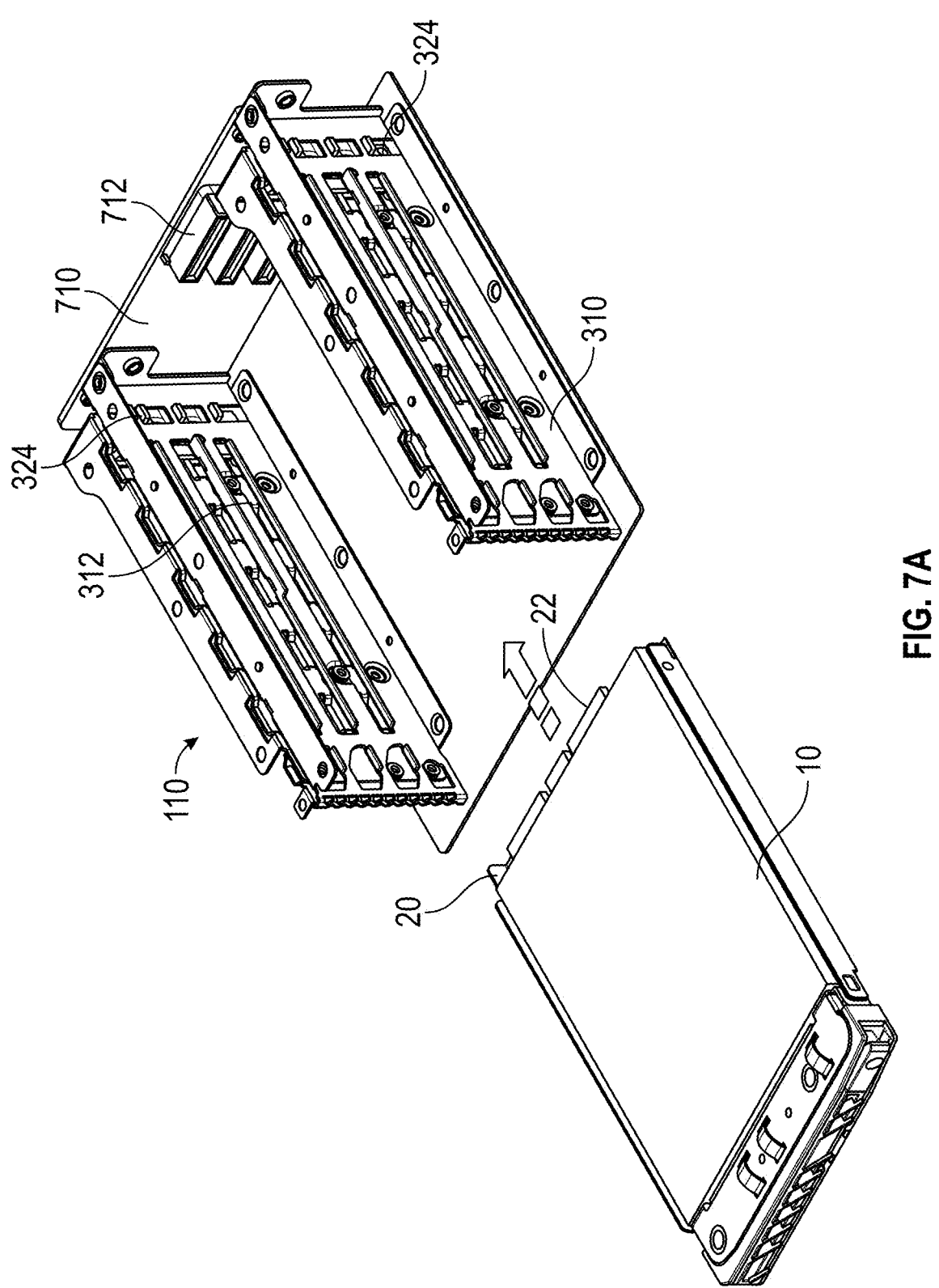
FIG. 7A shows a single width E3.S form factor module prior to insertion in a cage slot defined by the example cage dividers in FIG. 3.
Figure 7B:
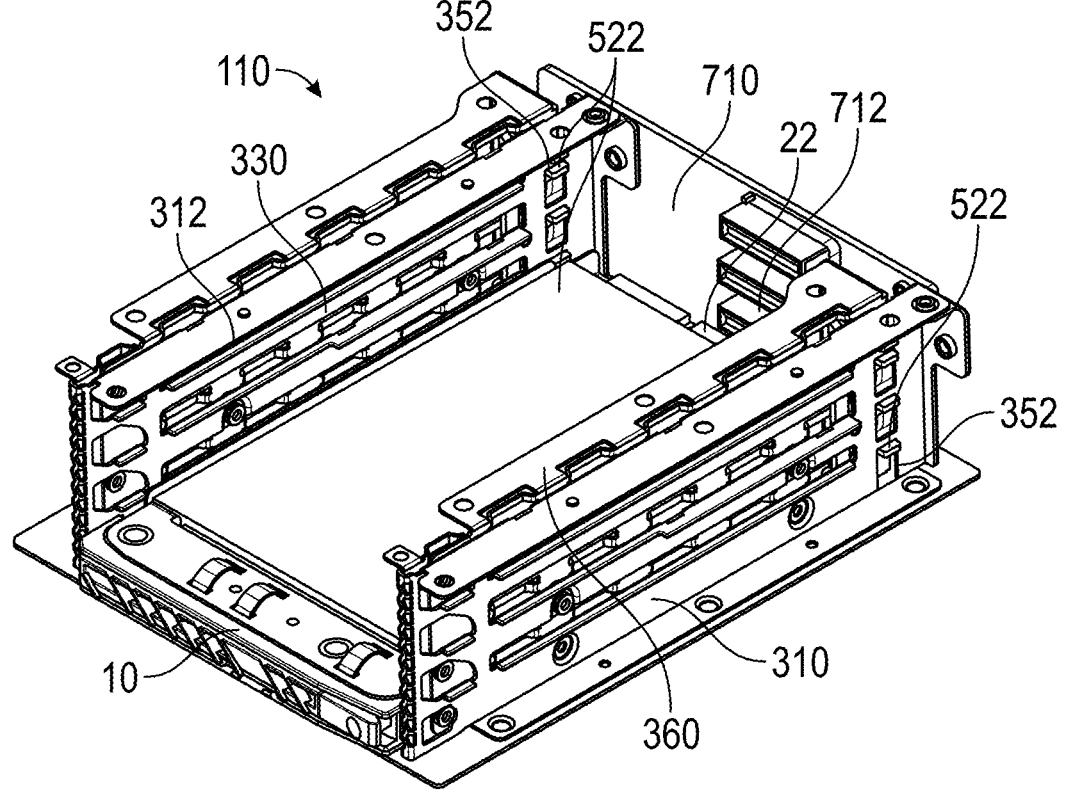
FIG. 7B shows the single width E3.S form factor module inserted in the cage slot defined by the example cage dividers in FIG. 3.

FIG. 7A-7B show the process of inserting an E3.S 1T module, such as the module 10 shown in FIG. 1A into the cage enclosure 110. In this example, both of the dividers 310 and 312 have been adjusted to accommodate E3.S 1T modules as explained above by adjusting the respective adjustment accessories 324 on the dividers 310 and 312 as shown in FIG. 6A. The cage enclosure 110 includes a 1T backplane 710 that allows for the connection of E3.S 1T modules. In this example, the backplane 710 has four stacked socket connectors 712 to mate with the corresponding connectors of the four E3.S 1T modules that may be inserted in the cage enclosure 110. The E3.2 1T module 10 is inserted in the bottom slot of the cage enclosure 110 as shown in FIG. 7B. Since the tabs 522 are positioned at the top of the vertical slots 452, the module 10 may be inserted all the way into the cage enclosure 110 as the tabs 522 are not at a level to block the registration feature 20 of the module 10. The gold finger connector 22 at the rear end of the module 10 may be inserted in the bottom socket connector 712 in the backplane 710.

Figure 7C:
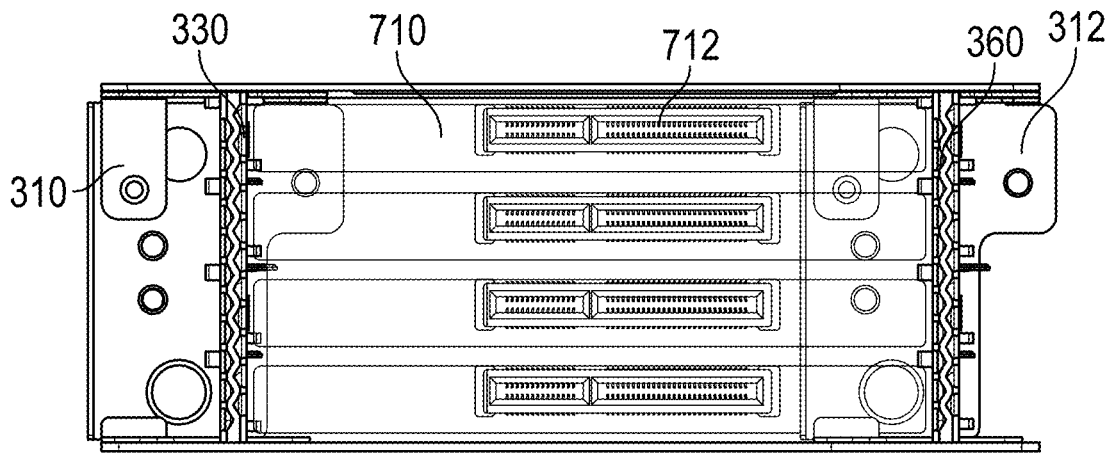
FIG. 7C is a front view of the server cage in FIG. 7A prior to insertion of the single width E3.S module.
Figure 7D:
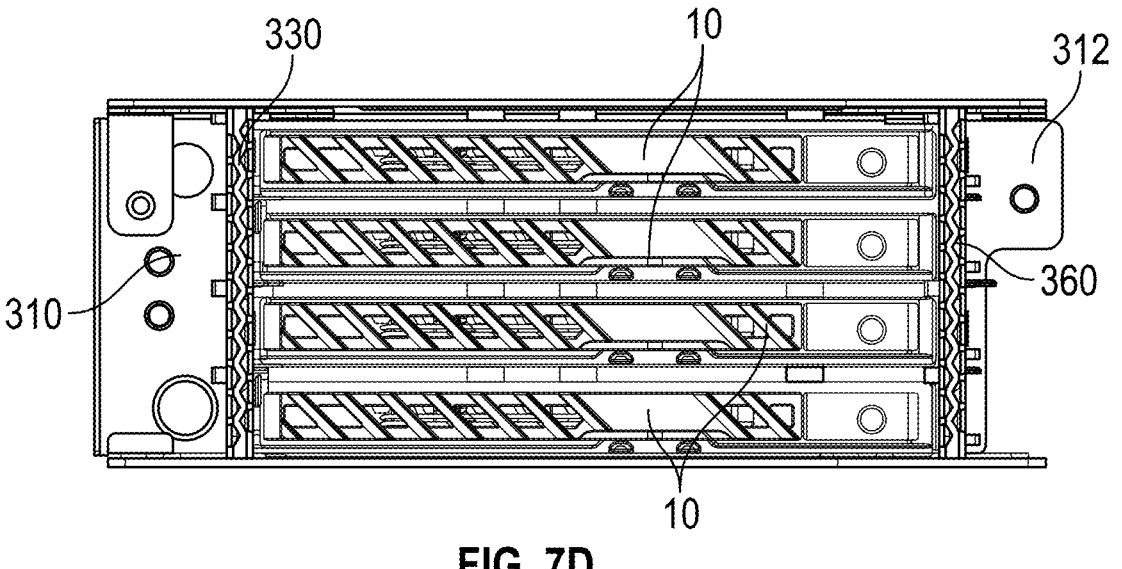
FIG. 7D is a front view of the server cage in FIG. 7A with the insertion of four single width E3.S modules.

FIG. 7C is a front view of the slots in the cage enclosure 110 created by the example cage dividers 310 and 312 that are adjusted for E3.S 1T modules. FIG. 7D is a front view of the cage enclosure with all four of the E3.S 1T modules 10 inserted in the cage enclosure 110 between the cage dividers 310 and 312.

Figure 8A:
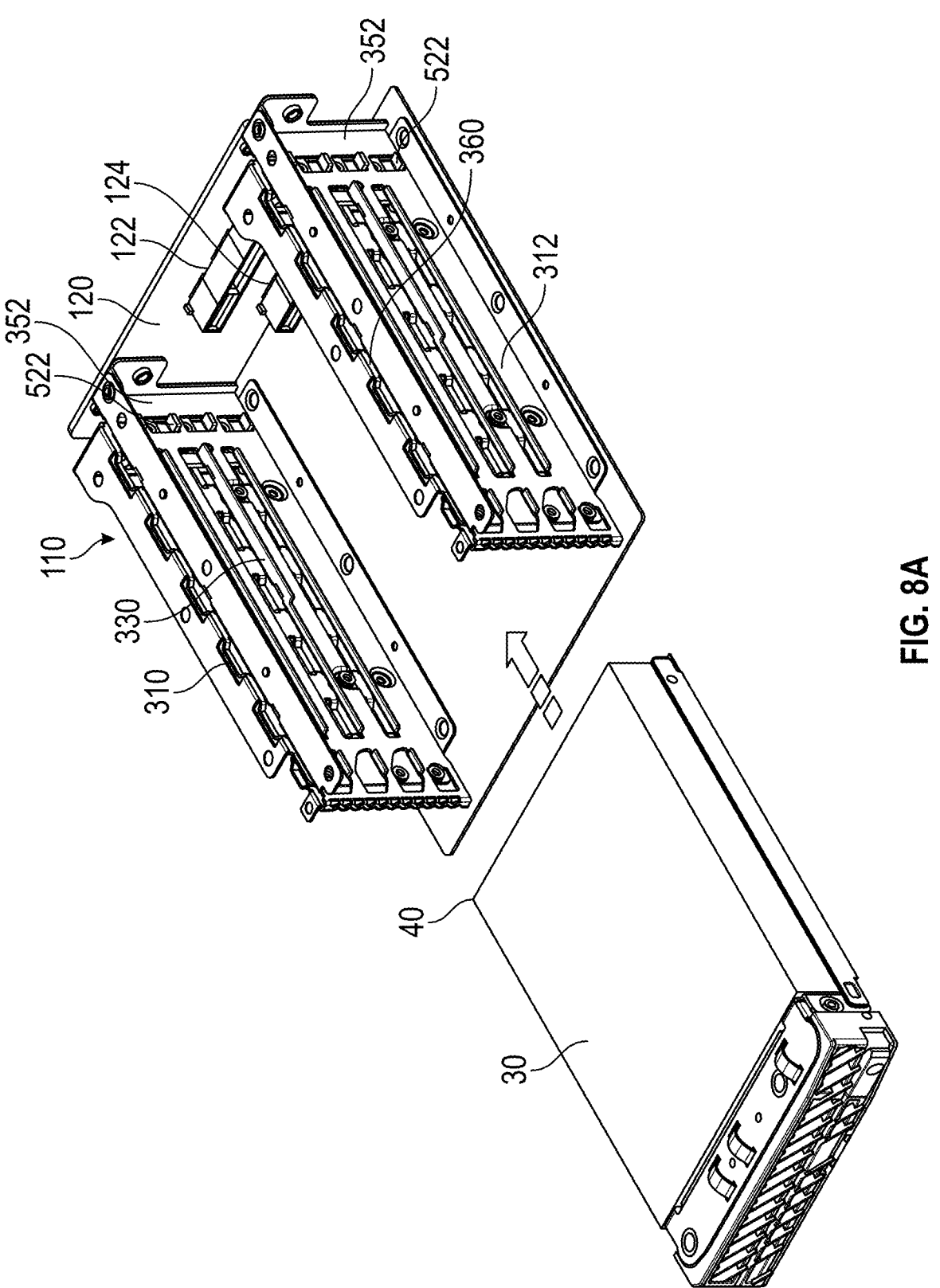
FIG. 8A shows a double width E3.S form factor module prior to insertion in a cage slot defined by the example cage dividers in FIG. 3.
Figure 8B:
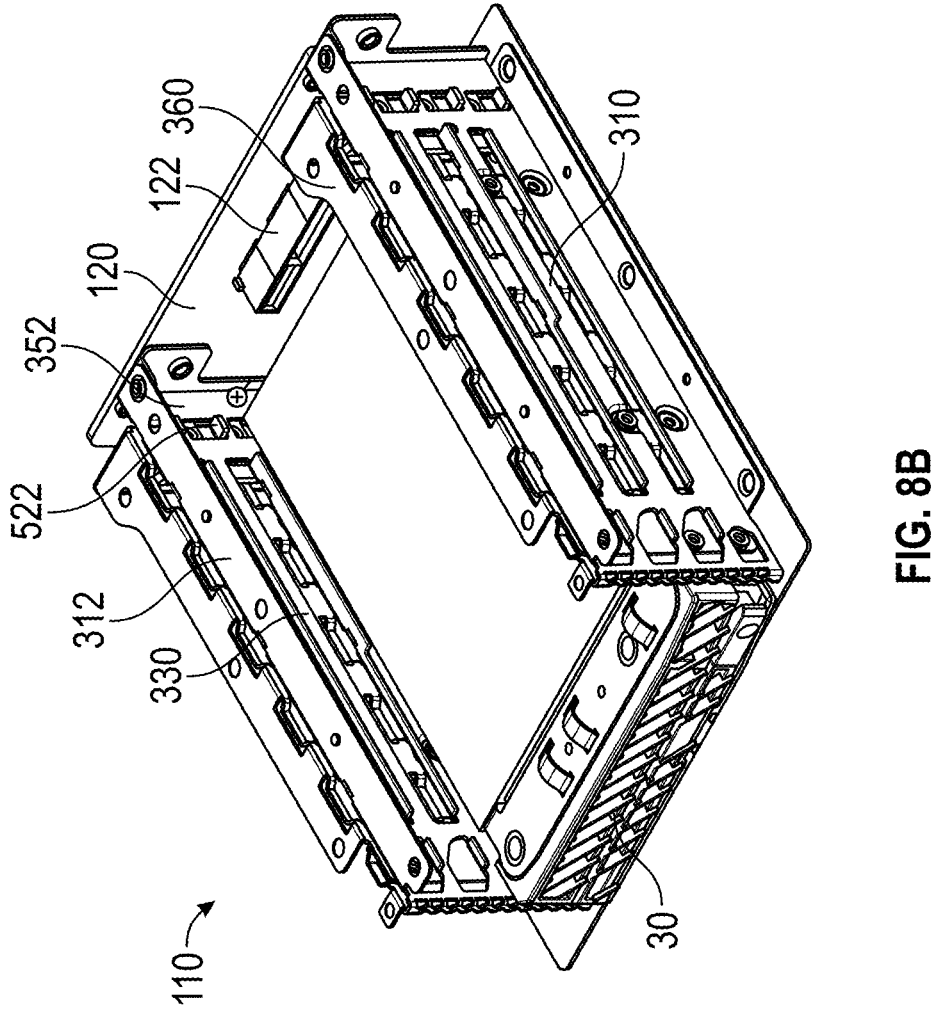
FIG. 8B shows the double width E3.S form factor module inserted in the cage slot defined by the example cage dividers in FIG. 3.

FIG. 8A-8B show the process of inserting an E3.S 2T module, such as the module 30 shown in FIG. 1D, into the cage enclosure 110. In this example, both of the dividers 310 and 312 have been adjusted to accommodate E3.S 2T modules as explained above by adjusting the respective adjustment accessories 324 on the dividers 310 and 312 to the position in FIG. 6B. The cage enclosure 110 includes the 2T backplane 120 that allows for the connection of E3.S 2T modules on the socket connector 122. In this example, the backplane 120 has the two stacked socket connectors 122 and 124 to accommodate the respective connectors of two E3.S 2T modules that may be inserted in the cage enclosure 110.

The E3.2 2T module 30 is inserted in the bottom slot of the cage enclosure 110 as shown in FIG. 8B. Since the tabs 522 are positioned at the bottom of the vertical slots 452 by the locked position of the adjustable accessory 324, the module 30 may be inserted all the way into the cage enclosure 110 as the tabs 522 are not at a level to block the registration feature 40 of the module 30. In this example, the registration feature 40 may be inserted under the bottom tab 522, allowing the full insertion of the module 30. The gold finger connector 42 of the module 30 may be inserted in the bottom socket connector 124 in the backplane 120.

Figure 8C:
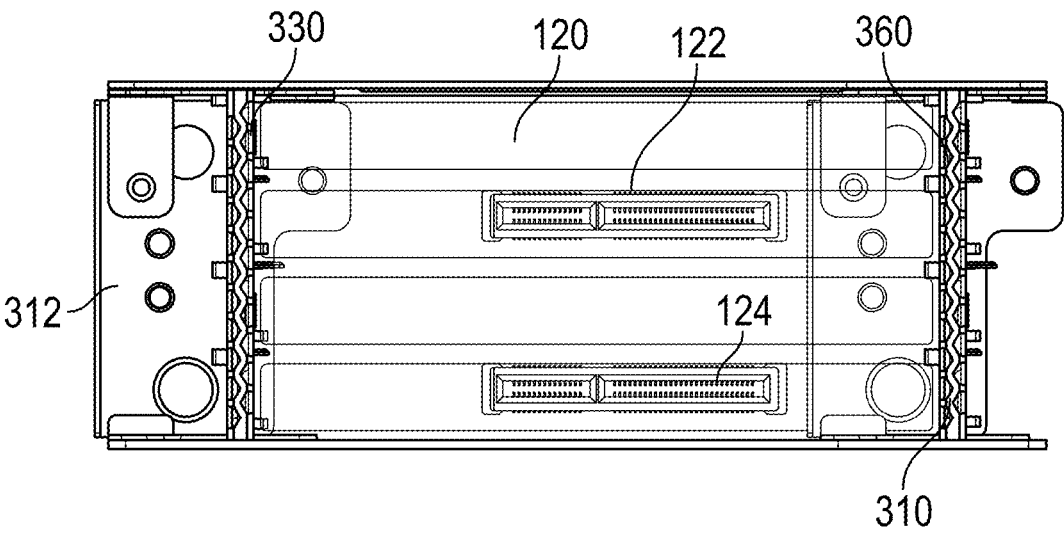
FIG. 8C is a front view of the server cage in FIG. 7A prior to insertion of the double width E3.S module.
Figure 8D:
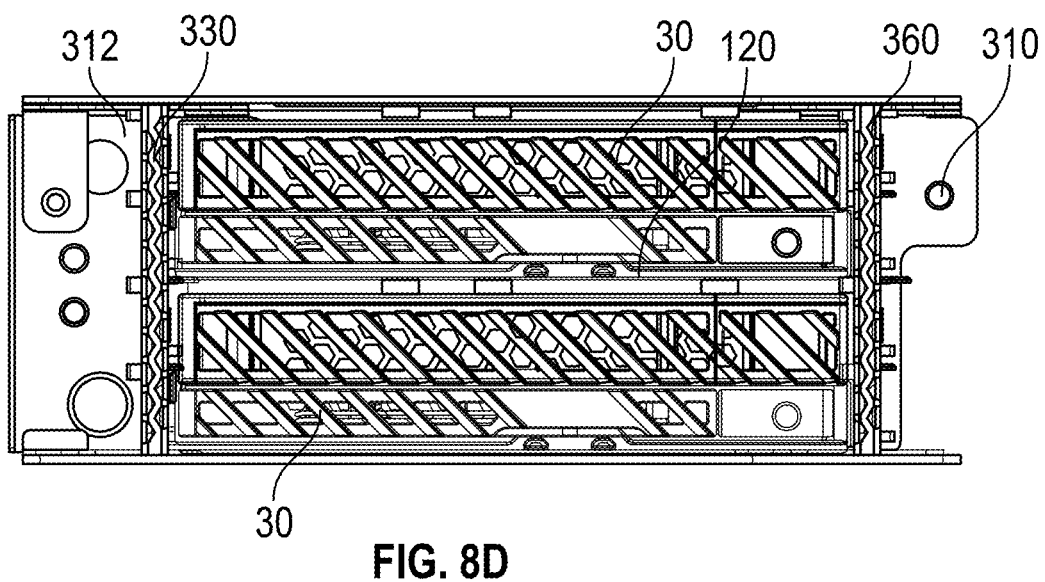
FIG. 8D is a front view of the server cage in FIG. 7A with the insertion of two double width E3.S modules.

FIG. 8C is a front view of the slots in the cage enclosure 110 created by the example cage dividers 310 and 312 that are adjusted for E3.S 2T modules. FIG. 8D is a front view of the cage enclosure with two E3.S 2T modules 30 inserted in the cage enclosure 110 between the cage dividers 310 and 312.

Figure 9A:
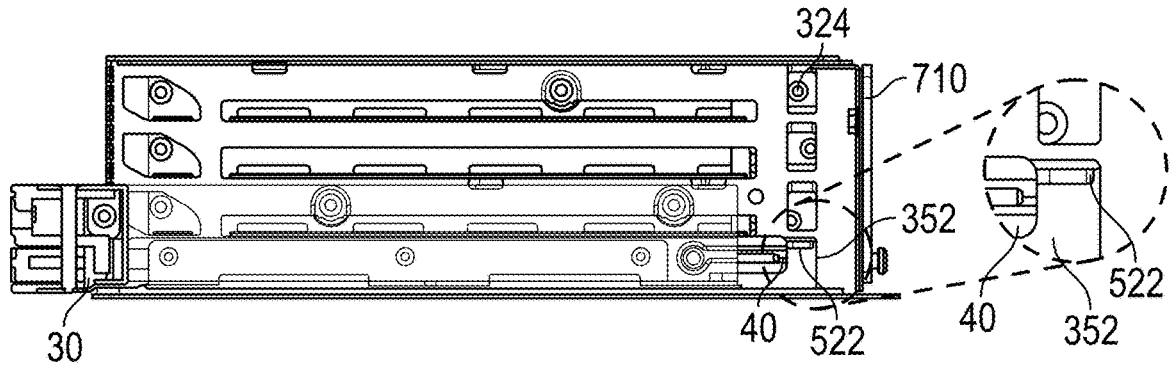
FIG. 9A is a side view of the example cage divider with the adjustment accessory configured to prevent the improper insertion of a double width E3.S module.
Figure 9B:
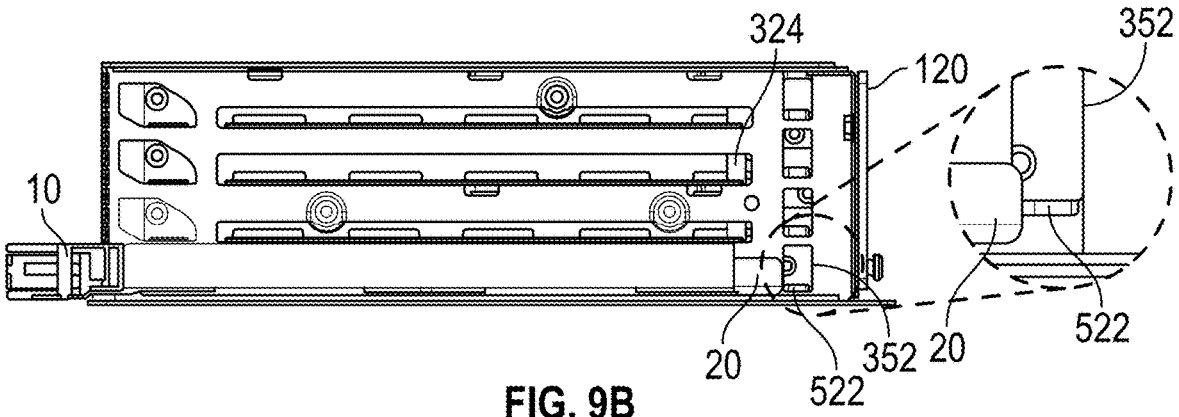
FIG. 9B is a side view of the example cage divider with the adjustment accessory configured to prevent the improper insertion of a single width E3.S module.

As shown in FIG. 9A-9B, the tabs 522 serve as stoppers that prevent the wrong E3.S module from being inserted. Thus, when the adjustment accessory 324 is positioned to allow the E3.S 1T module to be inserted, the tabs 522 are positioned at the top of the slots 352 as shown in FIG. 6A. In this position, the tabs 522 are at a level of the registration feature 40 of the E3.S 2T module 30 shown in FIG. 1D. Thus, if an E3.S 2T module 30 is inserted in the bottom slot as shown in FIG. 9A, the registration feature 40 of the module 30 will contact the tab 522 and prevent the E3.S 2T module from being improperly inserted fully into the back-plane 710. Similarly, the other tabs 522 will prevent an E3.S 2T module from being improperly inserted in the upper slot by blocking the path of the registration feature 40.

Similarly, when the adjustment accessory 324 is positioned to allow the E3.S 2T module to be inserted, the tabs 522 are positioned at the bottom of the slots 352 as shown in FIG. 6B. In this position, the tabs 522 are at a level of the registration feature 20 of the E3.S 1T module 10 shown in FIG. 1B. Thus, if an E3.S 1T module is inserted as shown in FIG. 9B, the registration feature 20 will contact the tab 522 and prevent the E3.S 1T module from being improperly inserted fully into the backplane 120. Similarly, the other tabs 522 will prevent an E3.S 1T module from being improperly inserted in any of the upper slots by blocking the path of the registration feature 20.

Figure 10A:
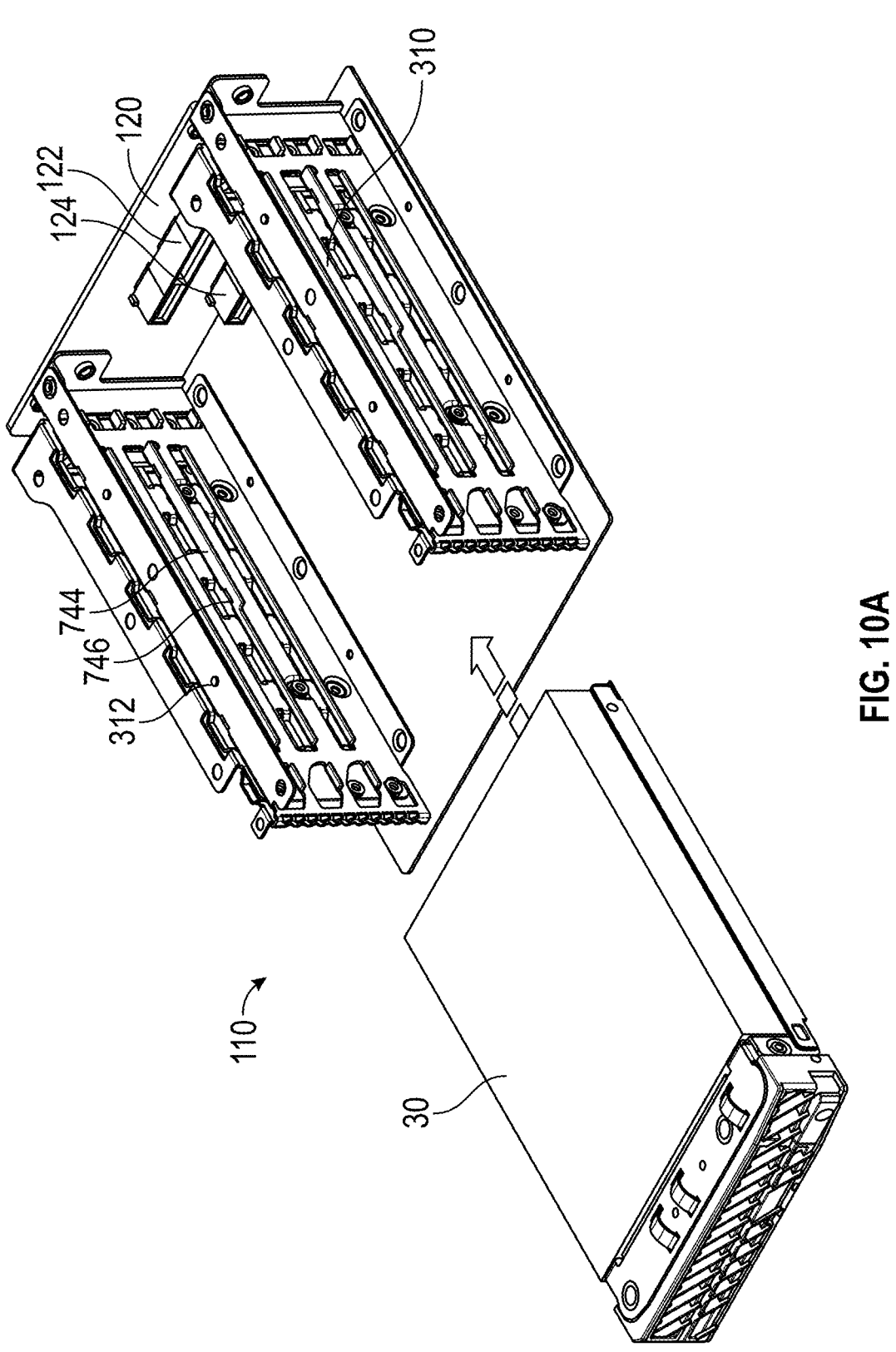
FIG. 10A is a front view of the server cage in FIG. 7A prior to improper insertion of the double width E3.S module.

The example cage dividers 310 and 312 also include other fool-proof features that prevent improper insertion of the E3.S 2T module. FIG. 10A is a front view of the cage enclosure 110 in FIG. 7A prior to improper insertion of the double width E3.S module 30. In this example, both of the dividers 310 and 312 have been adjusted to accommodate E3.S 2T modules as explained above by adjusting the respective adjustment accessories 324 on the dividers 310 and 312 to the position in FIG. 6B. The cage enclosure 110 includes the 2T backplane 120 that allows for the connection of E3.S 2T modules on the socket connector 122. In this example, the backplane 120 has the two stacked socket connectors 122 and 124 to accommodate the respective connectors of two E3.S 2T modules that may be inserted in the cage enclosure 110.

Figure 10B:
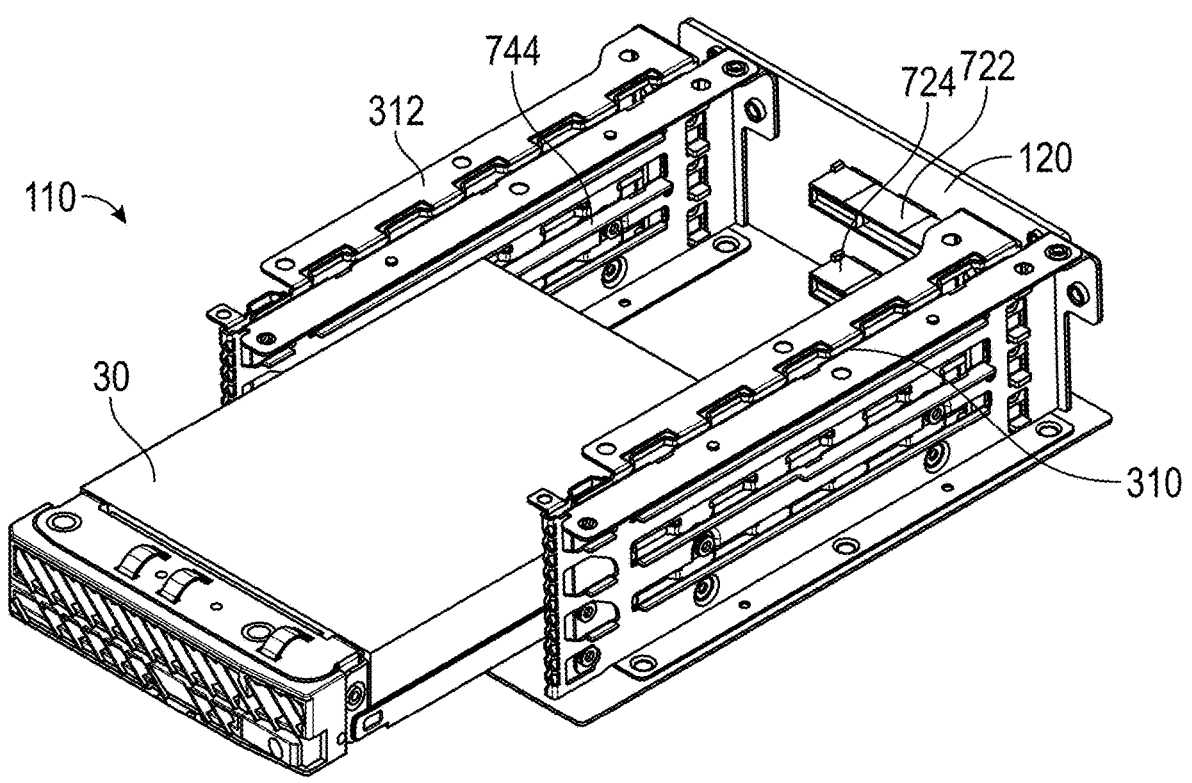
FIG. 10B is a front perspective view of the server cage in FIG. 7A with the attempted improper insertion of a double width E3.S module in one of the middle slots.
Figure 10C:
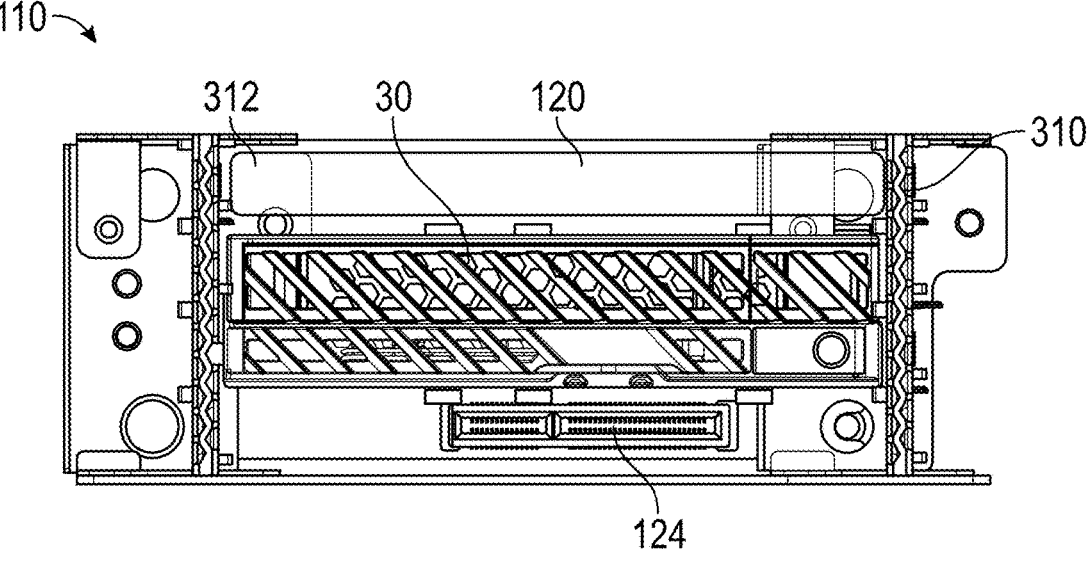
FIG. 10C is a front view of the server cage in FIG. 7A with the attempted improper insertion of a double width E3.S module in one of the middle slots.
Figure 10D:
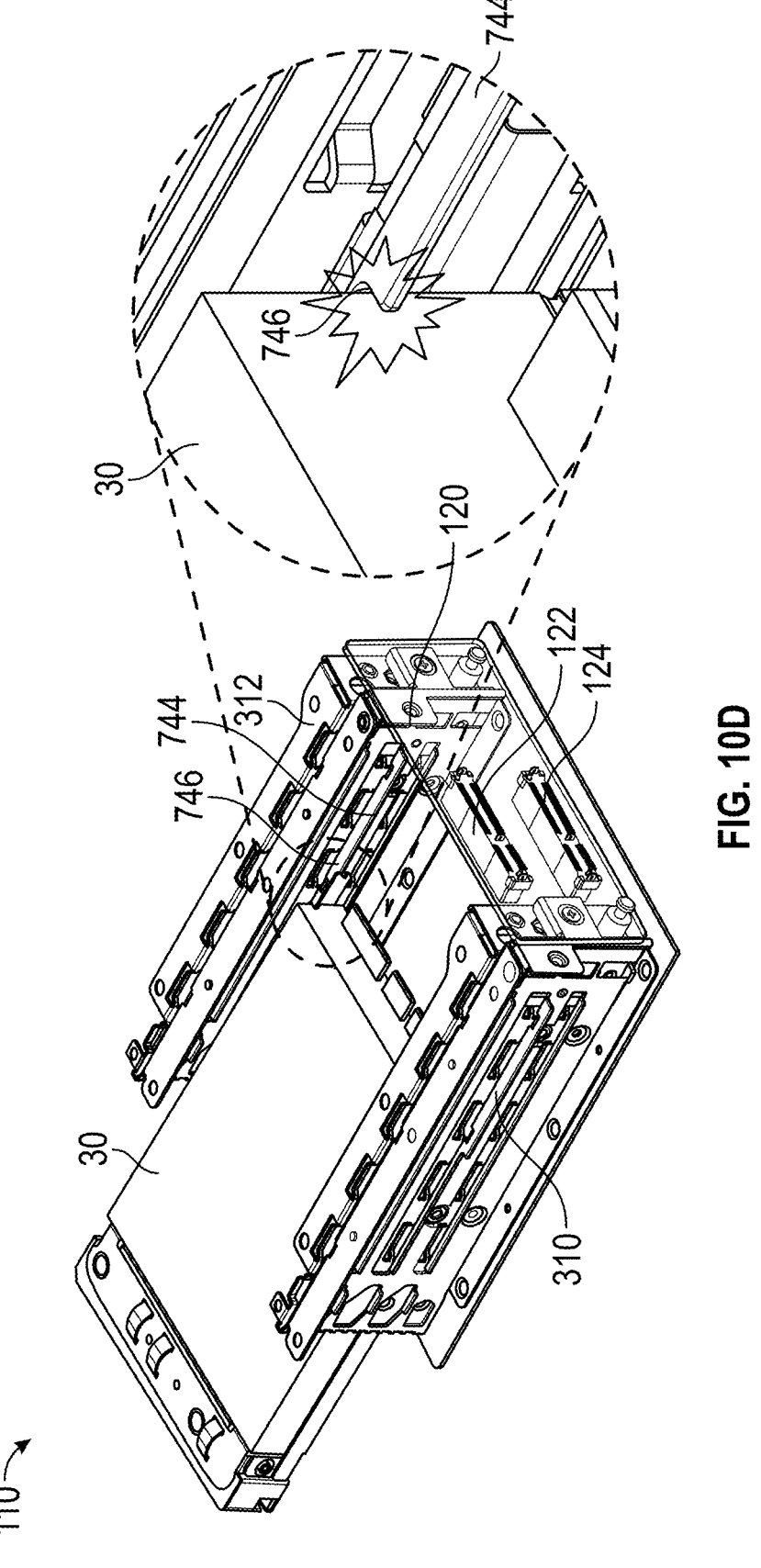
FIG. 10D is a back perspective view of the server cage in FIG. 7A showing a full-proof feature that prevents the full improper insertion of a double width E3.S module in one of the middle slots.

FIG. 10B is a front perspective view of the cage enclosure 110 in FIG. 7A with the improper partial insertion of the double width E3.S module 30 in one of the middle slots. FIG. 10C shows a front view of the improper insertion of the double width E2.S module 30. FIG. 10D shows a back perspective view of the cage enclosure 110 in FIG. 7A with the improper partial insertion of the double width E3.S module 30 in one of the middle slots. As shown in FIG. 10C, the insertion in this position is improper because the double width E3.S module cannot be connected to the connectors 122 or 124. As shown in FIG. 10D, the foolproof feature of the edge 346 of the tab 344 prevents the insertion of an E3.S 2T module in the third slot that is used for an E3.S 1T module.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution, and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A cage divider for a cage enclosure for different E3.S device carrier modules, the cage divider comprising:
   a first side component having a height spanning a height of the cage enclosure, the first side component attachable to a backplane of the cage enclosure;
   a second side component parallel to the first side component, the second side component spanning the height of the cage enclosure, and attached to the first side component; and
   an adjustable accessory held between the first side component and the second side component, the adjustable accessory configured to be attached in a first position allowing accommodation of a first E3.S module and moveable when held between the first side component and the second side component to be attached in a second position allowing accommodation of a second E3.S module.

2. The cage divider of claim 1, wherein the adjustable accessory includes a tab blocking insertion of the second E3.S module when in the first position and blocking insertion of the first E3.S module when in the second position.

3. The cage divider of claim 1, wherein the adjustable accessory includes a slot inserted on a registration pin coupled to the first side component.

4. The cage divider of claim 1, wherein the backplane includes connectors for connecting either the first E3.S module or the second E3.S module.

5. The cage divider of claim 1, wherein the adjustable accessory includes a locking screw insertable in one of a plurality of mounting holes in a side plate of the second side component, wherein one of the plurality of mounting holes corresponds to the first position and another of the plurality of mounting holes corresponds to the second position.

6. The cage divider of claim 1, wherein the first type of E3.S module is a E3.S 1T form factor including a carrier and an electronic device and wherein the second type of E3.S module is a E3.S 2T form factor including a carrier and an electronic device.

7. The cage divider of claim 6, wherein the electronic device is a solid state drive (SSD).

8. The cage divider of claim 1, wherein the first side component includes a tab for attachment to either a first backplane having a connector mating with the first E3.S module or a second backplane having a connector mating with the second E3.S module.

9. The cage divider of claim 1, wherein the first and second side components include rivet holes allowing insertion of rivets to attach the first and second side components to each other.

10. A computer device comprising:
   a chassis;
   a cage defined by the chassis;
   a backplane at a rear of the cage; and
   a pair of cage dividers defining a slot in the cage, wherein each of the cage dividers includes:
      a first side component plate having a height spanning a height of the cage enclosure, the first side component plate attachable to the backplane of the cage enclosure;
      a second side component parallel to the first side component, the second side component spanning the height of the cage enclosure, and attached to the first side component; and
      an adjustable accessory held between the first side component and the second side component, the adjustable accessory configured to be attached in a first position allowing accommodation of a first E3.S module and moveable when held between the first side component and the second side component to be attached in a second position allowing accommodation of a second E3.S module.

11. The computer device of claim 10, wherein the adjustable accessory includes a tab blocking insertion of the second E3.S module when in the first position and blocking insertion of the first E3.S module when in the second position.

12. The computer device of claim 10, wherein the adjustable accessory includes a slot inserted on a registration pin coupled to the first side component.

13. The computer device of claim 10, wherein the backplane includes connectors for connecting either the first E3.S module or the second E3.S module.

14. The computer device of claim 10, wherein the adjustable accessory includes a locking screw insertable in one of a plurality of mounting holes in a side plate of the second side component, wherein one of the plurality of mounting holes corresponds to the first position and another of the plurality of mounting holes corresponds to the second position.

15. The computer device of claim 10, wherein the first type of E3.S module is a E3.S 1T form factor including a carrier and an electronic device and wherein the second type of E3.S module is a E3.S 2T form factor including a carrier and an electronic device.

16. The computer device of claim 15, wherein the electronic device is a solid state drive (SSD).

17. The computer device of claim 10, wherein the first side component includes a tab for attachment to either a first backplane having a connector mating with the first E3.S module or a second backplane having a connector mating with the second E3.S module.

18. The computer device of claim 10, wherein the first and second side components include rivet holes allowing insertion of rivets to attach the first and second side components to each other.

19. The computer device of claim 10, wherein the computer device is a server.

* * * * *